US012230699B2

(12) United States Patent
Piedra et al.

(10) Patent No.: US 12,230,699 B2
(45) Date of Patent: Feb. 18, 2025

(54) MODIFICATION OF ELECTRIC FIELDS OF COMPOUND SEMICONDUCTOR DEVICES

(71) Applicant: Analog Devices, Inc., Norwood, MA (US)

(72) Inventors: Daniel Piedra, Cambridge, MA (US);
James G. Fiorenza, Carlisle, MA (US);
Puneet Srivastava, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 363 days.

(21) Appl. No.: 17/067,988

(22) Filed: Oct. 12, 2020

(65) Prior Publication Data

US 2021/0126120 A1 Apr. 29, 2021

Related U.S. Application Data

(60) Provisional application No. 62/924,892, filed on Oct. 23, 2019.

(51) Int. Cl.
*H01L 29/778* (2006.01)
*H01L 29/10* (2006.01)
*H01L 29/16* (2006.01)
*H01L 29/20* (2006.01)
*H01L 29/66* (2006.01)

(52) U.S. Cl.
CPC ...... *H01L 29/7786* (2013.01); *H01L 29/1033* (2013.01); *H01L 29/1608* (2013.01); *H01L 29/2003* (2013.01); *H01L 29/66462* (2013.01)

(58) Field of Classification Search
CPC ..... H01L 29/402–407; H01L 29/66431; H01L 29/66462; H01L 29/778–7789
See application file for complete search history.

(56) References Cited

U.S. PATENT DOCUMENTS 7,538,366 B2 5/2009 Saito et al.
7,573,078 B2 8/2009 Wu et al.
(Continued)

FOREIGN PATENT DOCUMENTS

CN 104241351 4/2018
JP 2012084653 4/2012
(Continued)

OTHER PUBLICATIONS

"Taiwanese Application Serial No. 109136246, First Office Action mailed Apr. 15, 2022", w/ English Machine Translation, 10 pgs.
(Continued)

*Primary Examiner* — Eric A. Ward
(74) *Attorney, Agent, or Firm* — Schwegman Lundberg & Woessner, P.A.

(57) ABSTRACT

Integrated circuits can include semiconductor devices with back-side field plates. The semiconductor devices can be formed on substrates that have conductive layers located within the substrates. The conductive layers can include at least one of a conducting material or a semi-conducting material that modifies an electric field produced by the semiconductor devices. The semiconductor devices can include one or more semiconductor layers that include one or more materials having a compound material that includes at least one Group 13 element and at least one Group 15 element.

20 Claims, 12 Drawing Sheets

(56) References Cited

U.S. PATENT DOCUMENTS

| | | | |
|---|---|---|---|
| 7,812,369 B2 | 10/2010 | Chini et al. | |
| 8,759,879 B1* | 6/2014 | Tipirneni | H01L 29/41766 257/190 |
| 9,112,009 B2 | 8/2015 | Charles et al. | |
| 9,196,693 B2 | 11/2015 | Curatola et al. | |
| 9,728,630 B2 | 8/2017 | Prechtl et al. | |
| 9,818,692 B2 | 11/2017 | Roberts et al. | |
| 2006/0060895 A1* | 3/2006 | Hikita | H01L 29/7787 257/280 |
| 2012/0153300 A1* | 6/2012 | Lidow | H01L 29/7787 257/77 |
| 2012/0187451 A1* | 7/2012 | Saito | H01L 29/808 257/192 |
| 2013/0153967 A1* | 6/2013 | Curatola | H01L 29/66462 257/E29.246 |
| 2014/0016360 A1 | 1/2014 | Makiyama et al. | |
| 2014/0091364 A1* | 4/2014 | Imanishi | H01L 29/66431 257/194 |
| 2015/0333135 A1 | 11/2015 | Makiyama et al. | |
| 2016/0141354 A1* | 5/2016 | Curatola | H01L 29/7783 438/172 |
| 2016/0141405 A1 | 5/2016 | Werner et al. | |
| 2016/0225863 A1* | 8/2016 | Simin | H01L 29/872 |
| 2016/0372555 A1* | 12/2016 | Twynam | H01L 27/095 |
| 2017/0069716 A1* | 3/2017 | Roberts | H01L 21/02378 |
| 2017/0294528 A1 | 10/2017 | Ren et al. | |
| 2017/0373176 A1* | 12/2017 | Sriram | H01L 29/66431 |
| 2018/0175186 A1* | 6/2018 | Chen | H01L 29/0623 |
| 2019/0081039 A1* | 3/2019 | Siemieniec | H01L 29/8083 |
| 2020/0273976 A1* | 8/2020 | Chou | H01L 29/407 |
| 2022/0149034 A1* | 5/2022 | Cai | H01L 27/0711 |
| 2022/0254911 A1* | 8/2022 | Li | H01L 21/266 |

FOREIGN PATENT DOCUMENTS

| | | |
|---|---|---|
| TW | 201324773 A | 6/2013 |
| TW | 201417280 A | 5/2014 |
| TW | I799746 B | 4/2023 |

OTHER PUBLICATIONS

Amano, H, "The 2018 GaN power electronics roadmap", Journal of Physics D: Applied Physics, 51 163001, IOP Publishing, Ltd., UK, (2018), 49 pgs.

Choi, Young Chul, "The Effect of an Fe-doped GaN Buffer on off-State Breakdown Characteristics in AlGaN GaN HEMTs on Si Substrate", IEEE Transactions on Electron Devices, 53(12), (Dec. 2006), 2926-2931.

Hikita, M, "AlGaN GaN power HFET on silicon substrate with source-via grounding (SVG) structure", IEEE Transactions on Electron Devices, 52(9), (Sep. 2005), 1963-1968.

Omura, Ichiro, "Gallium Nitride power HEMT for high switching frequency power electronics", IEEE International Workshop on Physics of Semiconductor Devices, Mumbai, IN, (Dec. 16-20, 2007), 6 pgs.

Ren, Fan, "Backside Source Field Plate Method that Uses Via Hole to Better Dissipate Heat", Office of Technology Licensing, University of Florida, [Online] Retrieved from the Internet: <URL: https://web.archive.org/web/20150910021318/http://technologylicensing.research.ufl.edu/technologies/15178.pdf>, (Archived Sep. 10, 2015), 2 pgs.

Udrea, F, "High voltage devices—a milestone concept in power ICs", IEDM Technical Digest. IEEE International Electron Devices Meeting, San Francisco, CA, USA, (Dec. 13-15, 2004), 451-454.

* cited by examiner

MODIFICATION OF ELECTRIC FIELDS OF COMPOUND SEMICONDUCTOR DEVICES

CLAIM OF PRIORITY

This patent application claims the benefit of priority from provisional U.S. patent application No. 62/924,892, filed Oct. 23, 2019, entitled, "MODIFICATION OF ELECTRIC FIELDS OF COMPOUND SEMICONDUCTOR DEVICES," and naming Daniel Piedra et al. as inventors, the disclosure of which is incorporated by reference herein, in its entirety.

STATEMENT REGARDING FEDERALLY SPONSORED RESEARCH

This invention was made with U.S. Government support under Agreement No. HR0011-18-3-0014, awarded by Defense Advanced Research Projects Agency. The U.S. Government has certain rights in the invention.

FIELD OF THE DISCLOSURE

This document pertains generally, but not by way of limitation, to apparatuses and methods related to the use of conductive layers to modify electric fields produced by semiconductor devices.

BACKGROUND

Electronic devices that are constructed from compound semiconductor materials can operate at higher frequencies and with higher power levels than similar silicon-based devices. The advantages of these compound semiconductor devices are derived, at least in part, from the higher critical breakdown field of compound semiconductors, such as gallium nitride (GaN), as compared to silicon (Si). For example, gallium nitride has a critical breakdown field of 3 MV/cm, while Si has a critical breakdown field of 0.3 MV/cm. The performance of these compound semiconductor devices may be improved by shaping the electric fields generated within these devices, such as by using source field plates to minimize electric field peaks, such as to enable these devices to be safely driven by higher voltages.

SUMMARY OF THE DISCLOSURE

Integrated circuits can include semiconductor devices with back-side field plates. The semiconductor devices can be formed on substrates that have conductive layers located within the substrates. The conductive layers can include at least one of a conducting material or a semi-conducting material that modifies an electric field produced by the semiconductor devices. The semiconductor devices can include one or more semiconductor layers that include one or more materials having a compound material that includes at least one Group 13 element and at least one Group 15 element.

A semiconductor device can include a back-side field plate to modify an electric field produced by the semiconductor device. The semiconductor device can comprise a substrate including a conductive layer disposed in a region of the substrate. The conductive layer can comprise at least a portion of the back-side field plate and the conductive layer can comprise at least one of a conducting material or a semi-conducting material. The semiconductor device can also comprise a channel layer disposed on a surface of the substrate. The channel layer can comprise a first compound material having a Group 13 element and Group 15 element. In addition, the semiconductor device can comprise a barrier layer disposed on the channel layer. The barrier layer can comprise a second compound material having a Group 13 element and a Group 15 element.

A process to modify an electric field produced by a semiconductor device can comprise forming a conductive layer in a region of a substrate. The process can comprise disposing a compound semiconductor layer on the substrate. The compound semiconductor layer can include a barrier layer and a channel layer, where the channel layer can be comprised of a compound material having a Group 13 element and Group 15 element. In addition, the process can comprise forming the semiconductor device with the compound semiconductor layer. The conductive layer can be configured to modify the electric field produced by the semiconductor device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various implementations discussed in the present document.

DETAILED DESCRIPTION

Figure 1:
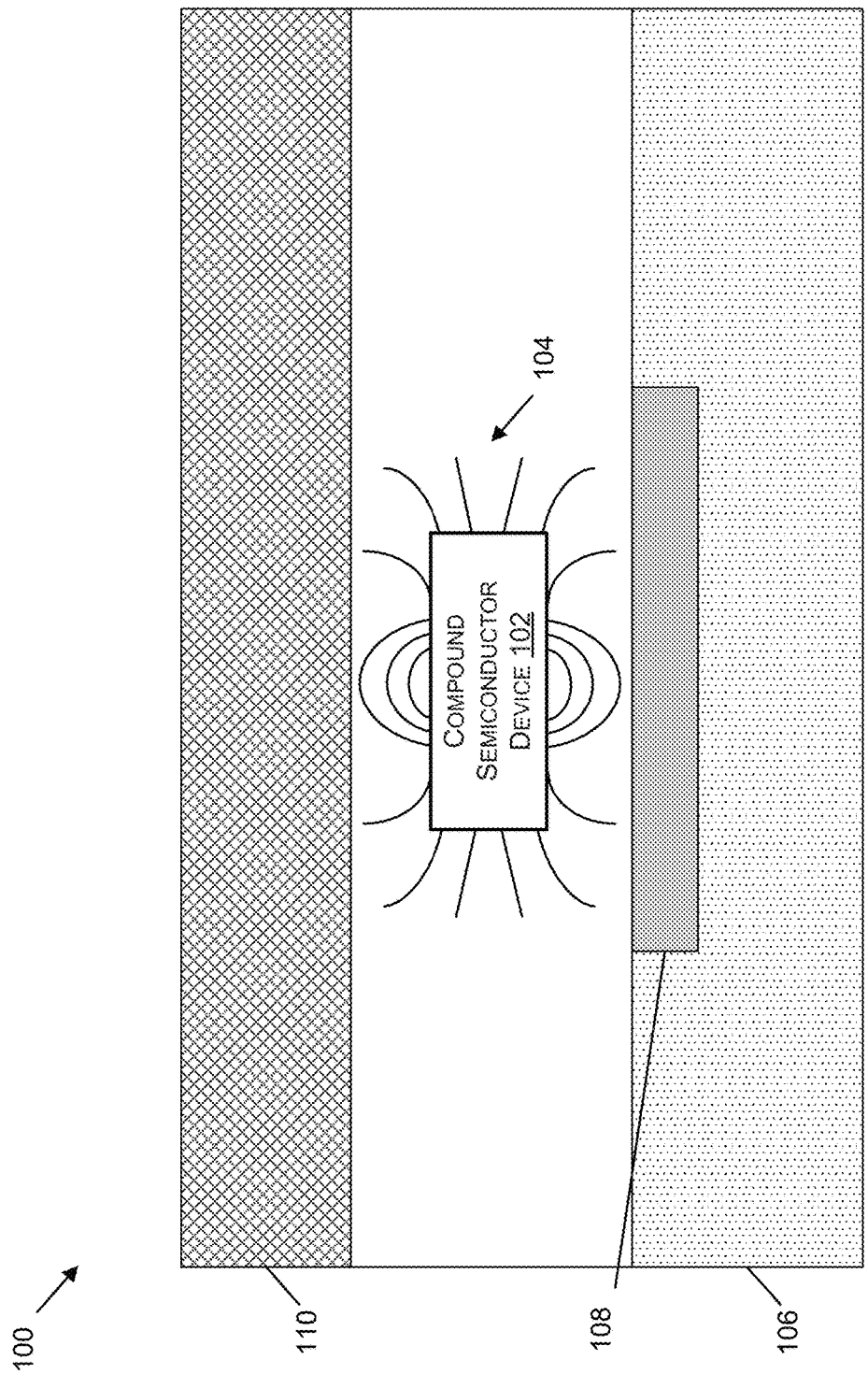
FIG. 1 is a diagram depicting a cross-section of at least a portion of an example integrated circuit including a compound semiconductor device having one or more conductive layers to modify an electric field produced by the compound semiconductor device.

Integrated circuit components can be formed using one or more compound semiconductors. The one or more compound semiconductors can include a combination of a Group 13 element and a Group 15 element. The integrated circuit components described herein can also comprise one or more compound semiconductors that have one or more combinations of elements that are different from a Group 13 element and a Group 15 element combination. To illustrate, integrated circuit components described herein can comprise zinc oxide (ZnO).

The integrated circuit components described herein can include transistors, such as field effect transistors. In particular examples, high electron mobility transistors (HEMTs) can be produced. HEMTs can include a first layer comprising a first compound semiconductor coupled with one or more second layers comprising one or more second compound semiconductors. The one or more second compound semiconductors can have a different bandgap and polarization field from the first compound semiconductor. The first layer and the one or more second layers can together form one or more heterostructures.

The first compound semiconductor that comprises the first layer can include a combination of one or more group 13 elements and one or more group 15 elements. For example, the first compound semiconductor can include gallium nitride (GaN). In addition, the first compound semiconductor can include aluminum nitride (AlN). Further, the first compound semiconductor can include gallium arsenide (GaAs). The first compound semiconductor can also include indium phosphide (InP).

A second compound semiconductor that comprises a second layer coupled to the first layer can include a combination of one or more group 13 elements and one or more group 15 elements. To illustrate, the second compound semiconductor can include aluminum gallium nitride (AlGaN). Additionally, the second compound semiconductor can include aluminum indium gallium nitride (AlInGaN). Further, the second compound semiconductor can include indium aluminum nitride (InAlN).

An example of a heterostructure that includes a first compound semiconductor and one or more second compound semiconductors can include a GaN layer coupled with an AlGaN layer. Another example of a heterostructure that includes a first compound semiconductor and one or more second compound semiconductors can include an AlN layer coupled with an InAlN layer. Additional examples of heterostructures can include AlN/GaN/AlN and InAlN/GaN. Further, various other combinations of elements from Group 13 (e.g., boron (B), aluminum (Al), gallium (Ga), indium (In) and thallium (Tl)) with elements from group 15 (e.g., nitrogen (N), phosphorus (P), arsenic (As), antimony (Sb), and bismuth (Bi)) can form heterostructures that can be used to form compound semiconductor devices.

The coupling of a first layer comprising a first compound semiconductor with one or more second layers comprised of one or more second compound semiconductors can create an interface between the layers that has a relatively high electron mobility. The interface can be a two-dimensional electron gas (2DEG). When a voltage is applied to a gate electrical contact of a compound semiconductor device, an electric field can be produced that can cause the movement of electrons within a channel region that includes the 2DEG. In this way, current between a source region and a drain region of a compound semiconductor device can be controlled.

One or more examples of a compound semiconductor device can include a GaN-based semiconductor device that includes a layer comprised of GaN. GaN-based semiconductor devices can be used in power circuitry, such as high-power density integrated circuits and power conversion integrated circuits. GaN-based transistors can also be used in monolithic microwave integrated circuits (MMICs) that operate at relatively high frequencies. MMICs can include electronic components that operate at frequencies within the microwave range of electromagnetic radiation. For example, MMICs can include electronic components that operate at frequencies from about 300 megahertz (MHz) to about 300 gigahertz (GHz). In illustrative examples, a high-power density can be a power density of at least 5 watts per millimeter (W/mm) and a high frequency can be a frequency of at least 5 gigahertz (GHz).

One or more conductive layers can be placed at various locations around a compound semiconductor device to affect an electric field produced by the operation of the compound semiconductor device. The one or more conductive layers can include conductive or semi-conductive materials. For example, the one or more conductive layers can include one or more n-type materials or one or more p-type materials. In illustrative examples, the one or more conductive layers can include GaN, germanium (Ge), silicon (Si), or one or more combinations thereof. Additionally, the conductive layers can include metallic materials. The conductive layers can be placed at various locations with respect to a compound semiconductor device. The conductive layers can be referred to as "field plates". In illustrative examples, one or more field plates can be formed over at least one of a source electrical contact, a drain electrical contact, or a gate electrical contact of a compound semiconductor device. In additional examples, one or more field plates can be formed below the channel of the compound semiconductor device. These field plates can be referred to as "back-side field plates".

The placement of one or more field plates proximate to one or more regions of a compound semiconductor device can produce a desired electric field profile across one or more portions of the compound semiconductor device. To illustrate, a field plate placed over a channel of a compound semiconductor device can spread out the electrical field and reduce peaks of the electric field. As a result, a breakdown voltage of the compound semiconductor device can increase. Additionally, field plates located below a channel of a compound semiconductor device can also shape an electric field produced by a compound semiconductor device to minimize charge trapping, device breakdown, and other reliability and performance issues.

A back-side field plate can be epitaxially formed, such as by growing and patterning, on a substrate of a compound semiconductor device during the formation of the semiconductor device. As used herein, the term epitaxy refers to the formation (e.g., deposition or growth) of a crystalline layer or film on the surface of a crystalline substrate, whereby the formed layer takes on the crystal structure and lattice properties of the substrate. Epitaxy can be used in semiconductor device fabrication to form thin-films of single crystals. Epitaxy can be performed in the vapor phase, liquid phase, or solid phase. In illustrative examples, molecular beam epitaxy ("MBE") can be used for growing field plates during the manufacturing of compound semiconductor devices.

Implementations described herein are directed to manufacturing compound semiconductor devices with one or more back side field plates located within a substrate on which the compound semiconductor device is formed. The one or more back-side field plates can be formed by producing a trench in the substrate and implanting or growing the one or more back-side field plates within the trench. In additional examples, the one or more back-side field plates can be implanted within the substrate followed by activation and polishing processes. Further, one or more temporary substrates can be used to attach a base substrate having a field plate to a compound material semiconductor layer. The thickness of a compound semiconductor channel layer can be controlled and reduced, in some situations, according to implementations described herein due to the processes used to manufacture the compound semiconductor device. The thickness of the channel layer of the compound semiconductor device can affect the effectiveness of the back-side field plate. For example, as the back-side field plate is positioned closer to the compound semiconductor device, the effectiveness in modifying the electrical field can increase. Thus, a compound semiconductor channel layer having a relatively low thickness value can increase the effectiveness of the back-side field plate in modifying the electrical field produced by the compound semiconductor device. In situations where the compound semiconductor channel layer is relatively thick, the effectiveness of the back-side field plate in modifying the electrical field of the compound semiconductor device can be reduced.

Conventional buffer layers of compound semiconductor devices can be doped with iron (Fe) dopants and/or carbon (C) dopants in an effort to reduce leakage currents and increase breakdown voltage. However, the Fe dopants and/or Si dopants can cause current to be trapped in the channel that can result in poor transient response of these compound semiconductor devices. Compound semiconductor devices described herein can be free of Fe dopants and Si dopants leading to improved current collapse, which can occur when the on-resistance of the compound semiconductor material increases due to the trapped electrons in the channel. In addition, thermal performance of compound semiconductor devices described herein can be improved over conventional compound semiconductor devices. For example, the substrate on which the compound semiconductor channel layer is disposed can have a higher thermal conductivity than the compound semiconductor channel layer. To illustrate, a silicon carbide (SiC) substrate can have a higher thermal conductivity than a GaN channel layer. Accordingly, since the compound semiconductor devices described herein can have thinner channel layers than conventional compound semiconductor devices, heat can be better distributed throughout the compound semiconductor device due to the closer proximity of the channel layer to a thermally conductive substrate than conventional compound semiconductor devices.

FIG. 1 is a diagram depicting a cross-section of at least a portion of an example integrated circuit 100 including a compound semiconductor device 102 having one or more conductive layers to modify an electric field produced by the compound semiconductor device 102. The compound semiconductor device 102 can include a compound semiconductor layer that includes a channel layer and a barrier layer. The channel layer can include a GaN layer. The channel layer can also include a GaAs layer. In one or more additional examples, the channel layer can include an AlN layer. In one or more further examples, the channel layer can include an InP layer. The barrier layer can include an AlGaN layer. In addition, the barrier layer can include an AlInGaN layer.

The compound semiconductor device 102 can also include a nucleation layer on which the channel layer is formed. In addition, the compound semiconductor device 102 can include a drain region, a source region, and a gate region located in the barrier layer. In illustrative examples, at least one of the drain region, the source region, or the gate region can include one or more dopants. The drain region can be coupled to a drain electrical contact, the source region can be coupled to a source electrical contact, and a gate region can be coupled to a gate electrical contact. During operation of the compound semiconductor device 102, an electric field 104 can be produced. To illustrate, in situations when current is flowing through a channel of the compound semiconductor device 102, the electric field 104 can be produced.

The integrated circuit 100 can include a substrate 106. The substrate 106 can include an Si-containing material. For example, the substrate 106 can be an SiC-containing substrate. Additionally, the substrate 106 can be a sapphire-containing substrate. The substrate 106 can also be an aluminum nitride-(AlN) containing substrate. Further, the substrate 106 can include polycrystalline AlN.

The substrate 106 can also include a conductive layer 108. The conductive layer 108 can include an n-type material. In addition, the conductive layer 108 can include a p-type material. In illustrative examples, the conductive layer 108 can include a GaN material. In additional examples, the conductive layer 108 can include an AlN material. Further, the conductive layer 108 can include a Si-containing material. The conductive layer 108 can also include a Ge-containing material. The conductive layer 108 can affect the electric field 104 to improve performance of the compound semiconductor device 102 in relation to conventional compound semiconductor devices.

The conductive layer 108 can be within a threshold distance of one or more components of the compound semiconductor device 102. The threshold distance can correspond to a distance over which an electric field can be produced by a compound semiconductor device and be modified by an electrical feature, such as a conductive layer. In conventional compound semiconductor devices, the distance between a surface of the substrate 102 that is adjacent to the compound semiconductor device 102 and one or more components of the compound semiconductor device 102 producing an electric field is greater than a threshold distance. Accordingly, a conductive layer included in the substrate adjacent to a compound semiconductor device would be too far from the compound semiconductor device to shape an electric field produced by the compound semiconductor device. In the implementations described herein, the conductive layer 108 is located sufficiently close to the compound semiconductor device 102 to modify an electric field produced by the compound semiconductor device 102. In one or more illustrative examples, the conductive layer 108 can be within a threshold distance of the compound semiconductor device 102 due to a decreased thickness of one or more of the intervening layers between the conductive layer 108 and the compound semiconductor device 102 in relation to the thicknesses of intervening layers in conventional devices.

One or more additional layers 110 can be disposed over the compound semiconductor device 102. To illustrate, one or more dielectric layers can be disposed over the compound semiconductor device 102. The one or more dielectric layers can include at least one of a SiN-containing material, a $SiO_2$ containing material, or a $Si_2N_3$-containing material. The one or more additional layers 110 can also include metallic materials. For example, one or more field plates can be disposed over portions of the compound semiconductor device 102. Additionally, the one or more additional layers 110 can include metal-containing features, such as capacitors, inductors, and interconnect devices. Further, one or more connectors coupling electronic components of the integrated circuit 100 to one another can be included in the one or more additional layers 110. In illustrative examples, one or more connectors can be included in the one or more additional layers 110 to couple the compound semiconductor device 102 to other electronic components.

Figure 2:
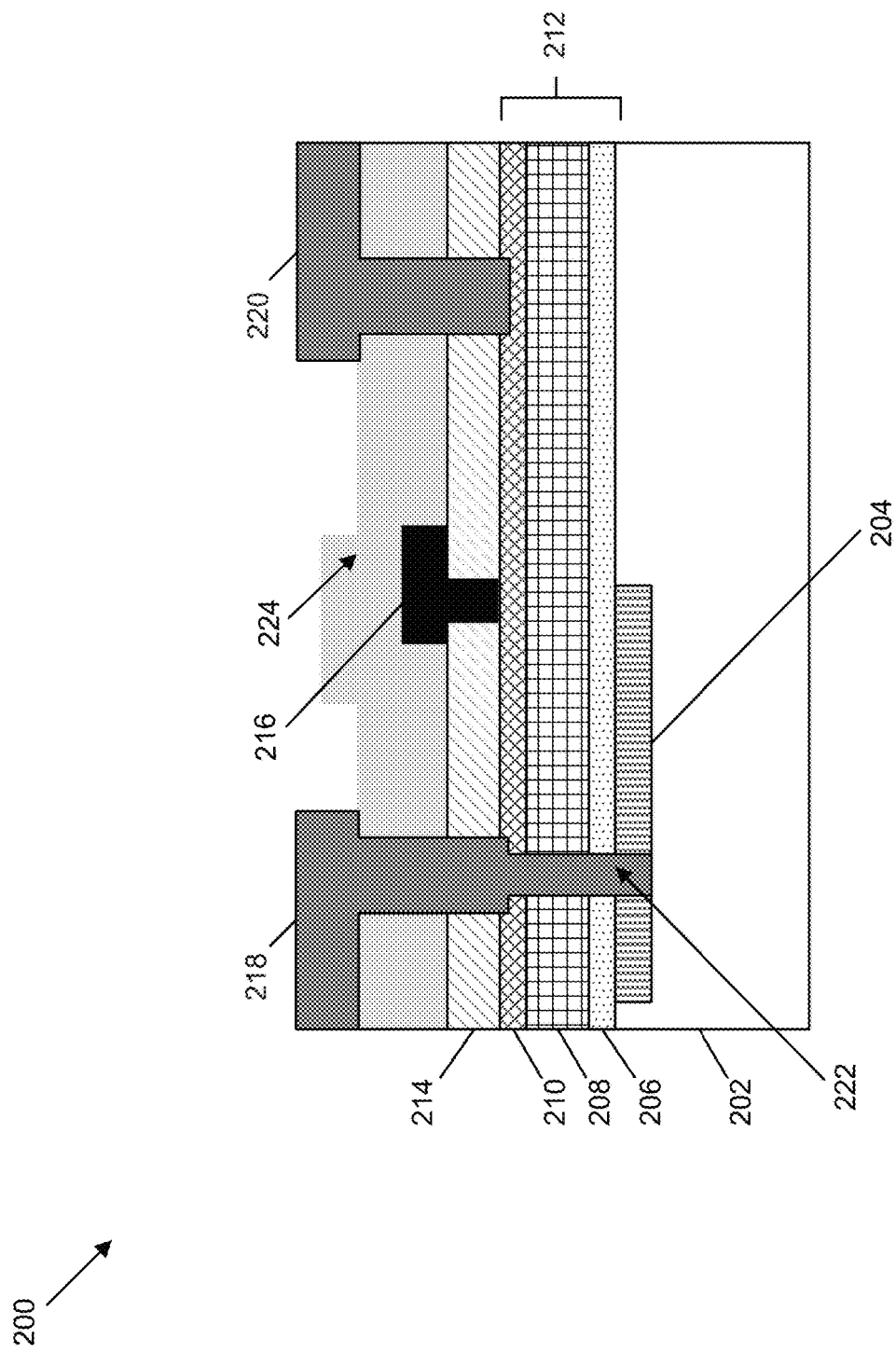
FIG. 2 is a diagram depicting a cross-section of at least a portion of components of an integrated circuit including a compound semiconductor device having one or more conductive layers to modify an electric field produced by the compound semiconductor device.

FIG. 2 is a diagram depicting a cross-section of at least a portion of components of an example integrated circuit 200 including a compound semiconductor device having one or more conductive layers to modify an electric field produced by the compound semiconductor device. The integrated circuit 200 can include a substrate 202. In illustrative examples, the substrate 202 can be an SiC-containing substrate. The substrate 202 can also include an Si-containing substrate.

Further, the substrate 202 can include a sapphire substrate. In one or more examples, the substrate 202 can include an aluminum nitride—(AlN) containing substrate. A thickness of the substrate 202 can be from about 100 micrometers to about 800 micrometers, from about 200 micrometers to about 700 micrometers, or from about 300 micrometers to about 600 micrometers.

A conductive layer 204 can be disposed within the substrate 202. The conductive layer 204 can comprise a portion of a surface of the substrate 202, in some examples. Further, the conductive layer 204 can be located below a surface of the substrate 202. In illustrative examples, the conductive layer 204 can be located at one or more depths below a surface of the substrate 202. For example, the conductive layer 204 can be located from about 0 nanometers to no greater than about 100 nanometers below a surface of the substrate 202. In addition, the conductive layer 204 can be located from about 10 nanometers to no greater than about 100 nanometers below a surface of the substrate 202. The conductive layer 204 can also be located from about 50 nanometers to about 250 nanometers below a surface of the substrate 202. Further, the conductive layer 204 can be located from about 10 nm to about 500 nm below a surface of the substrate 202.

The conductive layer 204 can include an n-type material, in some implementations. The conductive layer 204 can also include a p-type material. In illustrative examples, the conductive layer 204 can include an Si-containing material. Additionally, the conductive layer 204 can include a GaN-containing material. The conductive layer 204 can also include a Ge-containing material. Further, the conductive layer 204 can include a polysilicon-containing material. In additional examples, the conductive layer 204 can include an SiC-containing material. In various implementations, the conductive layer 204 can include one or more combinations of an n-type material, a p-type material, an Si-containing material, a GaN-containing material, an SiC-containing material, a Ge-containing material, or a polysilicon-containing material.

The conductive layer 204 can be configured as a back-side field plate to shape an electric field produced by a compound semiconductor device of the integrated circuit 200. A thickness of the conductive layer 204 can be from about 200 nanometers (nm) to about 1500 nm, from about 300 nm to about 1200 nm, or from about 400 nm to about 1000 nm. Although a single conductive layer 204 is shown in the illustrative example of FIG. 2, in additional implementations, a back-side field plate can include multiple conductive layers.

A nucleation layer 206 can be disposed on the substrate 202 and over the conductive layer 204. The nucleation layer 206 can have a thickness from about 10 nanometers to about 200 nanometers, from about 20 nanometers to about 100 nanometers, or from about 20 nanometers to about 80 nanometers. The nucleation layer 206 can include an AlN-containing material. The nucleation layer 206 can be used to form a first compound semiconductor layer 208. The first compound semiconductor layer 208 can include one or more compound semiconductors. The one or more compound semiconductors can include at least one element from Group 13 of the periodic table of elements and at least one element from Group 15 of the periodic table of elements. For example, the first compound semiconductor layer 208 can include GaN. In addition, the first compound semiconductor layer 208 can include GaAs. Further, the first compound semiconductor material 208 can include AlN. The first compound semiconductor material layer 208 can also include InP.

The first compound semiconductor layer 208 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm. In illustrative examples, the thickness of the first compound semiconductor layer 208 can be less than the thickness of a compound semiconductor layer of conventional compound semiconductor devices. For example, conventional compound semiconductor devices can include a first compound semiconductor layer having a channel portion and a buffer portion. The buffer portion of the first compound semiconductor layer can increase a thickness of the first compound semiconductor layer. However, the first compound semiconductor layer 208 can have a reduced thickness because the first compound semiconductor layer 208 does not include a buffer portion. Thus, the first compound semiconductor layer 208 is simply a channel layer. Reducing the thickness of the first compound semiconductor layer 208 can bring a compound semiconductor device into closer proximity with the substrate 202 than conventional compound semiconductor devices. The compound semiconductor device can include at least a second compound semiconductor layer, such as a barrier layer, a gate electrical contact, a source electrical contact, a drain electrical contact, and a dielectric layer, as described below. The decreased distance between the compound semiconductor device and the substrate 202 in relation to conventional compound semiconductor devices can improve the heat dissipation in the integrated circuit 200 due to an increased thermal conductivity of the substrate 202 with respect to the thermal conductivity of the first compound semiconductor layer 208. A decreased thickness of the first compound semiconductor layer 208 can also result in improved control of an electric field produced by the compound semiconductor device due to a closer proximity between the conductive layer 204 and the compound semiconductor device.

In addition, a second compound semiconductor layer 210 can be disposed on the first compound semiconductor layer 208. The second compound semiconductor layer 210 can include one or more compound semiconductors. The one or more compound semiconductors can include at least one element from Group 13 of the periodic table of elements and at least one element from Group 15 of the periodic table of elements. For example, the second compound semiconductor layer 210 can be an AlGaN barrier layer, in various implementations. The second compound semiconductor layer 210 can also be an AlInGaN barrier layer. A 2-dimensional electron gas (2DEG) layer can be formed at the interface of the first compound semiconductor layer 208 and the second compound semiconductor layer 210 that enables the flow of electrons through the 2DEG. The nucleation layer 206, the first compound semiconductor layer 208, and the second compound semiconductor layer 210 can comprise a semiconductor layer 212 that can be used to form one or more semiconductor devices, such as transistors. In illustrative examples, the 2DEG layer can be formed at an interface of a first compound semiconductor layer 208 that is comprised of GaN and a second compound semiconductor layer 210 comprised of AlGaN.

A first dielectric layer 214 can be disposed on the second compound semiconductor layer 210. The first dielectric layer 214 can include a SiN-containing material. Additionally, a gate electrical contact 216 can be disposed over a gate region of the second compound semiconductor layer 210. The gate electrical contact 216 can include one or more suitable metallic materials. For example, the gate electrical contact 216 can include a titanium nitride (TiN)/A material. The gate electrical contact 216 can also include a nickel (Ni)/gold (Au) material.

Further, a source electrical contact 218 can be disposed over a source region of the semiconductor layer 212 and a drain electrical contact 220 can be disposed over a drain region of the semiconductor layer 212. The source electrical contact 218 and the drain electrical contact 220 can include one or more suitable metallic materials. To illustrate, the source electrical contact 218 and the drain electrical contact 220 can include a Ti/Al material. In additional illustrative examples, the source electrical contact 218 and the drain electrical contact 220 can include a Ti/Au metallic material. A conductive layer contact 222 can electrically couple the source electrical contact 218 with the conductive layer 204.

At least one additional dielectric layer 224 can be disposed over the gate electrical contact 216. Further, at least a portion of the source electrical contact 218 and at least a portion of the drain electrical contact 220 can be disposed within the at least one additional dielectric layer 224. The at least one additional dielectric layer 224 can include a $SiO_2$ material, in some implementations. The at least one additional dielectric layer 224 can also include a $Si_2N_3$ material.

Although not shown in the illustrative example of FIG. 2, the integrated circuit 200 can include additional electronic components. For example, the integrated circuit 200 can include one or more resistors. In addition, the integrated circuit 200 can include one or more capacitors. Further, the integrated circuit 200 can include one or more field plates disposed on or within one or more of the dielectric layers 214, 224. The integrated circuit 200 can also include one or more inductors. In various examples, the integrated circuit 200 can include one or more interconnect devices.

Furthermore, although the conductive layer 204 is shown located under the gate electrical contact 216 and the source electrical contact 218 in the illustrative example of FIG. 2, in additional implementations, the conductive layer 204 can be disposed under at least one of the source electrical contact 218, the gate electrical contact 216, or the drain electrical contact 220. In additional examples, the conductive layer 204 can be aligned with at least one of the gate electrical contact 216 and a front side field plate disposed over the gate electrical contact 216. In these situations, the conductive layer 204 can be negatively biased and operate as an enhancement gate device to deplete the channel when a voltage above 0 volts (V) is applied to the gate electrical contact 216. In further examples, the conductive layer 204 can be disposed under the drain electrical contact 220 and the gate electrical contact 216. In these implementations, the conductive layer 204 can be coupled to the drain electrical contact by a conductive layer contact. In one or more examples, the conductive layer 204 can be coupled to the drain electrical contact 220 instead of to the source electrical contact 218.

Figure 3:
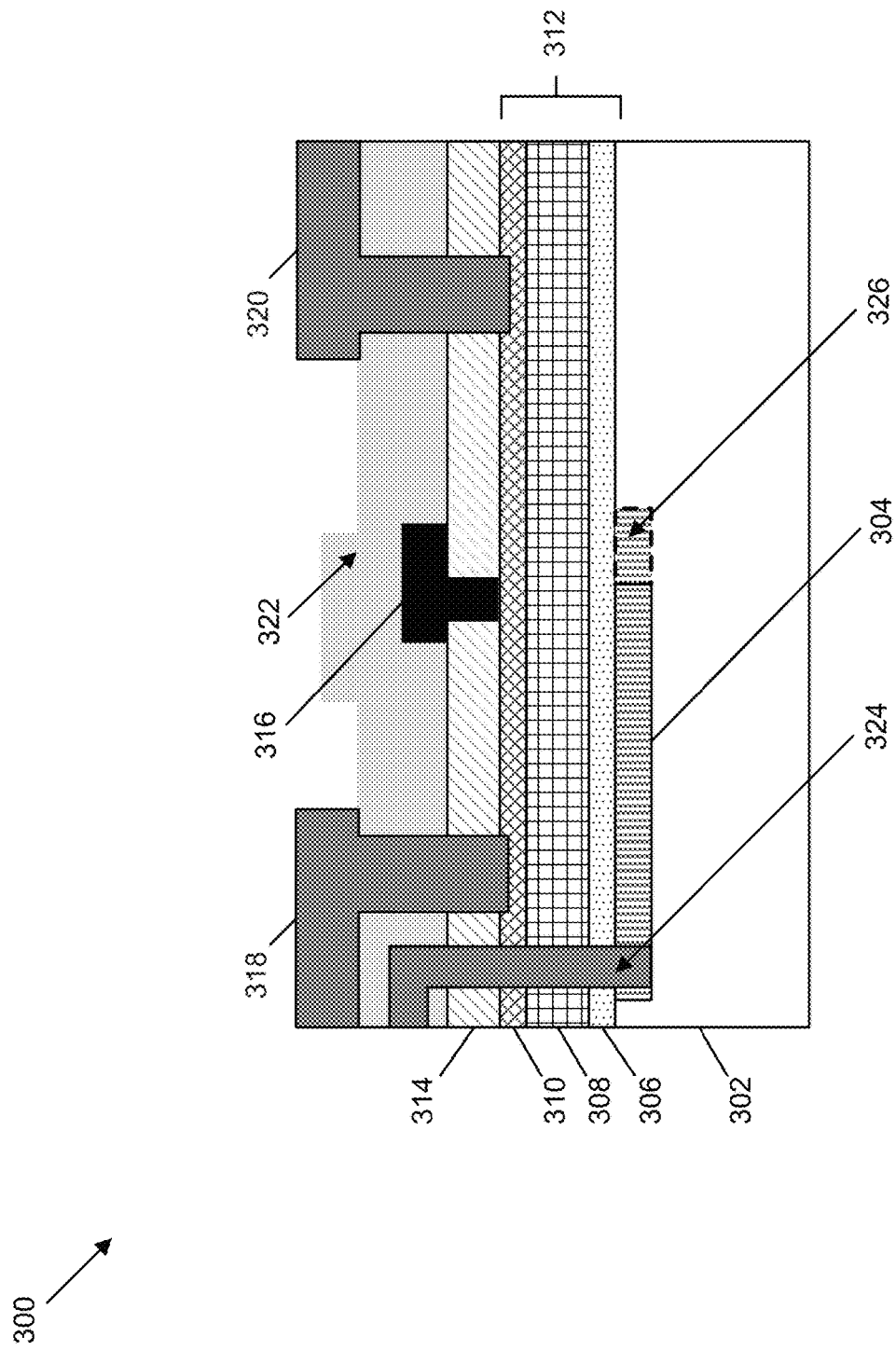
FIG. 3 is a diagram depicting a cross-section of at least a portion of components of an additional example integrated circuit including a compound semiconductor device having one or more conductive layers to modify an electric field produced by the compound semiconductor device.

FIG. 3 is a diagram depicting a cross-section of at least a portion of components of an additional example integrated circuit 300 including a compound semiconductor device having one or more conductive layers to modify an electric field produced by the compound semiconductor device. The illustrative example of FIG. 3 can include features similar to the features of FIG. 2. At least one difference between the illustrative example of FIG. 3 and the illustrative example of FIG. 2 is the electrical coupling of a conductive layer to a voltage source such that a voltage can be applied to the conductive layer.

The integrated circuit 300 can include a substrate 302. In illustrative examples, the substrate 302 can be an SiC-containing substrate. The substrate 302 can also include an Si-containing substrate. Further, the substrate 302 can include a sapphire substrate. In addition, the substrate 302 can be an AlN-containing substrate. In one or more examples, the substrate 302 can be a polycrystalline AlN-containing substrate. A thickness of the substrate 302 can be from about 100 micrometers to about 800 micrometers, from about 200 micrometers to about 700 micrometers, or from about 300 micrometers to about 600 micrometers.

A conductive layer 304 can be disposed within the substrate 302. The conductive layer 304 can comprise a portion of a surface of the substrate 302, in some examples. Further, the conductive layer 304 can be located below a surface of the substrate 302. In illustrative examples, the conductive layer 304 can be located at one or more depths below a surface of the substrate 302. For example, the conductive layer 304 can be located from about 0 nanometers to no greater than about 100 nanometers below a surface of the substrate 302. In addition, the conductive layer 304 can be located from about 10 nanometers to no greater than about 100 nanometers below a surface of the substrate 302. The conductive layer 304 can also be located from about 50 nanometers to about 250 nanometers below a surface of the substrate 302. Further, the conductive layer 304 can be located from about 10 nanometers to about 500 nanometers below a surface of the substrate 302.

The conductive layer 304 can include an n-type material, in some implementations. The conductive layer 304 can also include a p-type material. In illustrative examples, the conductive layer 304 can include an Si-containing material. Additionally, the conductive layer 304 can include a GaN-containing material. The conductive layer 304 can also include a Ge-containing material. Further, the conductive layer 304 can include a polysilicon-containing material. In additional examples, the conductive layer 304 can include an SiC-containing material. In various implementations, the conductive layer can include one or more combinations of an n-type material, a p-type material, an Si-containing material, a GaN-containing material, an SiC-containing material, a Ge-containing material, or a polysilicon-containing material.

The conductive layer 304 can be configured as a back-side field plate to shape an electric field produced by compound semiconductor device of the integrated circuit 300. A thickness of the conductive layer 304 can be from about 200 nanometers (nm) to about 1500 nm, from about 300 nm to about 1200 nm, or from about 400 nm to about 1000 nm. Although a single conductive layer 304 is shown in the illustrative example of FIG. 3, in additional implementations, a back-side field plate can include multiple conductive layers.

A nucleation layer 306 can be disposed on the substrate 302 and over the conductive layer 304. The nucleation layer 306 can have a thickness from about 10 nanometers to about 200 nanometers, from about 20 nanometers to about 100 nanometers, or from about 20 nanometers to about 80 nanometers. The nucleation layer 306 can include an AlN-containing material. The nucleation layer 306 can be used to form a first compound semiconductor layer 308. The first compound semiconductor layer 308 can include one or more compounds semiconductors that can include at least one element from Group 13 of the periodic table of elements and at least one element from Group 15 of the periodic table of elements. For example, the first compound semiconductor layer 308 can include GaN. In addition, the first compound semiconductor layer 308 can include GaAs. Further, the first compound semiconductor layer 308 can include AlN. The first compound semiconductor layer 308 can also include InP.

The first compound semiconductor layer 308 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm. In a manner similar to that described previously with respect to FIG. 2, the thickness of the first compound semiconductor layer 308 can be less than the thickness of a compound semiconductor layer of conventional compound semiconductor devices. In this way, the reduced thickness of the first compound semiconductor layer 308 can bring a compound semiconductor device into closer proximity with the substrate 302 than conventional compound semiconductor devices. The decreased distance between the compound semiconductor device and the substrate 302 in relation to conventional compound semiconductor devices can improve the heat dissipation in the integrated circuit 300 due to an increased thermal conductivity of the substrate 302 with respect to the thermal conductivity of the first compound semiconductor layer 308. A decreased thickness of the first compound semiconductor layer 308 can also result in improved control of an electric field produced by the compound semiconductor device due to a closer proximity between the conductive layer 304 and the compound semiconductor device.

In addition, a second compound semiconductor layer 310 can be disposed on the first compound semiconductor layer 308. The second compound semiconductor layer 310 can include one or more compound semiconductors. The one or more compound semiconductors can include at least one element from Group 13 of the periodic table of elements and at least one element from Group 15 of the periodic table of elements. For example, the second compound semiconductor layer 310 can be an AlGaN barrier layer, in various implementations. The second compound semiconductor layer 310 can also be an AlInGaN barrier layer. A 2-dimensional electron gas (2DEG) layer can be formed at the interface of the first compound semiconductor layer 308 and the second compound semiconductor layer 310 that enables the flow of electrons through the 2DEG. The nucleation layer 306, the first compound semiconductor layer 308, and the second compound semiconductor layer 310 can comprise a semiconductor layer 312 that can be used to form one or more semiconductor devices, such as transistors. In illustrative examples, the 2DEG layer can be formed at an interface of a first compound semiconductor layer 308 that is comprised of GaN and a second compound semiconductor layer 310 comprised of AlGaN.

A first dielectric layer 314 can be disposed on the second compound semiconductor layer 310. The first dielectric layer 314 can include a SiN-containing material. Additionally, a gate electrical contact 316 can be disposed over a gate region of the second compound semiconductor layer 310. The gate electrical contact 316 can include one or more suitable metallic materials. For example, the gate electrical contact 316 can include a titanium nitride (TiN)/Al material. The gate electrical contact 316 can also include a nickel (Ni)/gold (Au) material.

Further, a source electrical contact 318 can be disposed over a source region of the semiconductor layer 312 and a drain electrical contact 320 can be disposed over a drain region of the semiconductor layer 312. The source electrical contact 318 and the drain electrical contact 320 can include one or more suitable metallic materials. To illustrate, the source electrical contact 318 and the drain electrical contact 320 can include a Ti/Al material. In additional illustrative examples, the source electrical contact 318 and the drain electrical contact 320 can include a Ti/Au metallic material.

At least one additional dielectric layer 322 can be disposed over the gate electrical contact 316. Further, at least a portion of the source electrical contact 318 and at least a portion of the drain electrical contact 320 can be disposed within the at least one additional dielectric layer 322. The at least one additional dielectric layer 322 can include a $SiO_2$ material, in some implementations. The at least one additional dielectric layer 322 can also include a $Si_2N_3$ material.

The conductive layer 304 can be coupled to a voltage source using a conductive layer contact 324. The conductive layer contact 324 can be used to apply a positive voltage to the conductive layer 304. In addition, the conductive layer contact 324 can be used to apply a negative voltage to the conductive layer 304. In scenarios where a positive voltage is applied to the conductive layer 304, an electron density in a 2DEG between the first compound semiconductor material layer 308 and the second compound semiconductor material layer 310 can be increased. That is, electrons in the 2DEG can be pulled closer to the conductive layer 304 in response to a positive voltage being applied to the conductive layer 304. Applying a positive voltage to the conductive layer 304 can result in the compound semiconductor device having a more linear response than if a voltage was not applied to the conductive layer 304. That is, the output of the compound semiconductor device is more likely to be characterized by a linear function in response to the input than a compound semiconductor device that does not have a voltage applied to the conductive layer 304.

In implementations where a negative voltage is applied to the conductive layer 304, the electron density of the 2DEG can be reduced. Further, in the situations where a negative voltage is applied to the conductive layer 304, a length of the conductive layer 304 can be increased such that the conductive layer 304 is increased by an amount shown by the additional conductive layer portion 326. Accordingly, the conductive layer 304 plus the additional conductive layer portion 326 can be disposed under the source electrical contact 318, the gate electrical contact 316, and toward the drain electrical contact 320.

Although not shown in the illustrative example of FIG. 3, the integrated circuit 300 can include additional electronic components. For example, the integrated circuit 300 can include one or more resistors. In addition, the integrated circuit 300 can include one or more capacitors. Further, the integrated circuit 300 can include one or more field plates disposed on or within one or more of the dielectric layers 314, 322. The integrated circuit 300 can also include one or more inductors. In various examples, the integrated circuit 300 can include one or more interconnect devices.

Figure 4:
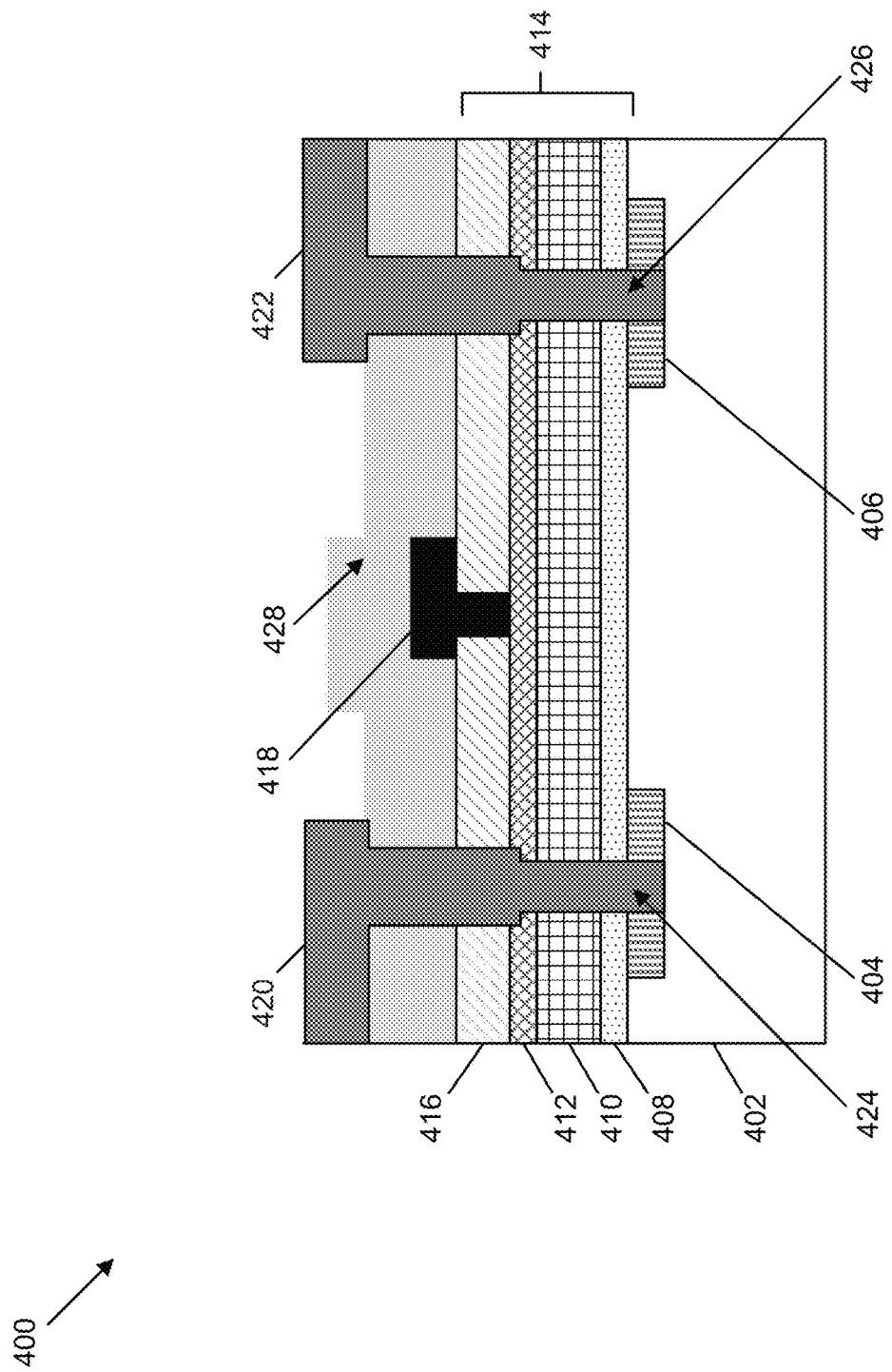
FIG. 4 is a diagram depicting a cross-section of at least a portion of components of an example integrated circuit including a compound semiconductor device having a p-type material conductive layer and an n-type material conductive layer to modify an electric field produced by the compound semiconductor device.

FIG. 4 is a diagram depicting a cross-section of at least a portion of components of an example integrated circuit 400 including a compound semiconductor device having a p-type material conductive layer and an n-type material conductive layer to modify an electric field produced by the compound semiconductor device. The integrated circuit 400 can include a substrate 402. In illustrative examples, the substrate 402 can be an SiC-containing substrate. The substrate 402 can also include an Si-containing substrate. Further, the substrate 402 can include a sapphire substrate. In one or more examples, the substrate 402 can include an AlN-containing substrate. Further, the substrate 402 can include a p-type material. A thickness of the substrate 402 can be from about 100 micrometers to about 800 micrometers, from about 200 micrometers to about 700 micrometers, or from about 300 micrometers to about 600 micrometers.

A first conductive layer 404 can be disposed within the substrate 402. The first conductive layer 404 can comprise a portion of a surface of the substrate 402, in some examples. Further, the first conductive layer 404 can be located below a surface of the substrate 402. In illustrative examples, the first conductive layer 404 can be located at one or more depths below a surface of the substrate 402. For example, the first conductive layer 404 can be located from about 0 nanometers to no greater than about 100 nanometers below a surface of the substrate 402. In addition, the first conductive layer 404 can be located from about 10 nanometers to no greater than about 100 nanometers below a surface of the substrate 402. The first conductive layer 404 can also be located from about 50 nanometers to about 250 nanometers below a surface of the substrate 402. Further, the first conductive layer 404 can be located from about 10 nm to about 500 nm below a surface of the substrate 402.

The first conductive layer 404 can include a p-type material. In illustrative examples, the first conductive layer 404 can include an Si-containing material. Additionally, the first conductive layer 404 can include a GaN-containing material. The first conductive layer 404 can also include a Ge-containing material. Further, the first conductive layer 404 can include a polysilicon-containing material. In additional examples, the first conductive layer 404 can include an SiC-containing material. In various implementations, the first conductive layer 404 can include a p-type material including one or more of an Si-containing material, a GaN-containing material, an SiC-containing material, a Ge-containing material, or a polysilicon-containing material.

A second conductive layer 406 can be disposed within the substrate 402. The second conductive layer 406 can be aligned laterally with the first conductive layer 404. The second conductive layer 406 can also be positioned at a depth of the substrate 402 that is different from a depth of the first conductive layer 404. The second conductive layer 406 can comprise a portion of a surface of the substrate 402, in some examples. Further, the second conductive layer 406 can be located below a surface of the substrate 402. In illustrative examples, the second conductive layer 406 can be located at one or more depths below a surface of the substrate 402. For example, the second conductive layer 406 can be located from about 0 nanometers to no greater than about 100 nanometers below a surface of the substrate 402. In addition, the second conductive layer 406 can be located from about 10 nanometers to no greater than about 100 nanometers below a surface of the substrate 402. The second conductive layer 406 404 can also be located from about 50 nanometers to about 250 nanometers below a surface of the substrate 402. Further, the second conductive layer 406 can be located from about 10 nm to about 500 nm below a surface of the substrate 402.

The second conductive layer 406 can include an n-type material. In illustrative examples, the second conductive layer 406 can include an Si-containing material. Additionally, the second conductive layer 406 can include a GaN-containing material. The second conductive layer 406 can also include a Ge-containing material. Further, the second conductive layer 406 can include a polysilicon-containing material. In additional examples, the second conductive layer 406 can include an SiC-containing material. In various implementations, the second conductive layer 406 can include an n-type material including one or more of an Si-containing material, a GaN-containing material, an SiC-containing material, a Ge-containing material, or a polysilicon-containing material.

The first conductive layer 404 and the second conductive layer 406 can be configured as back-side field plates to shape an electric field produced by a compound semiconductor device of the integrated circuit 400. In operation, the first conductive layer 404 having a p-type material and second conductive layer 406 having an n-type material can function as a pn device, such as a reverse bias diode, that breaks down if a voltage above a threshold amount is experienced by the semiconductor device. A thickness of the conductive layers 404, 406 can be from about 200 nanometers (nm) to about 1500 nm, from about 300 nm to about 1200 nm, or from about 400 nm to about 1000 nm.

A nucleation layer 408 can be disposed on the substrate 402 and over the first conductive layer 404 and the second conductive layer 406. The nucleation layer 408 can have a thickness from about 10 nanometers to about 200 nanometers, from about 20 nanometers to about 100 nanometers, or from about 20 nanometers to about 80 nanometers. The nucleation layer 408 can include an AlN-containing material. The nucleation layer 408 can be used to form a first compound semiconductor layer 410. The first compound semiconductor layer 410 can include one or more compound semiconductors. The one or more compound semiconductors can include at least one element from Group 13 of the periodic table of elements and at least one element from Group 15 of the periodic table of elements. For example, the first compound semiconductor layer 410 can include GaN.

In addition, the first compound semiconductor layer 410 can include GaAs. Further, the first compound semiconductor layer 410 can include AlN. The first compound semiconductor layer 410 can also include InP.

The first compound semiconductor layer 410 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm. In a manner similar to that described previously with respect to FIG. 2, the thickness of the first compound semiconductor layer 410 can be less than the thickness of a compound semiconductor layer of conventional compound semiconductor devices. Thus, reducing the thickness of the first compound semiconductor layer 410 can bring a compound semiconductor device into closer proximity with the substrate 402 than conventional compound semiconductor devices. The compound semiconductor device can include at least a second compound semiconductor layer, such as a barrier layer, a gate electrical contact, a source electrical contact, a drain electrical contact, and a dielectric layer, as described below. The decreased distance between the compound semiconductor device and the substrate 402 in relation to conventional compound semiconductor devices can improve the heat dissipation in the integrated circuit 400 due to an increased thermal conductivity of the substrate 402 with respect to the thermal conductivity of the first compound semiconductor layer 410. A decreased thickness of the first compound semiconductor layer 410 can also result in improved control of an electric field produced by the compound semiconductor device due to a closer proximity between the first conductive layer 404 and the second conductive layer 406 with respect to the compound semiconductor device.

In addition, a second compound semiconductor layer 412 can be disposed on the first compound semiconductor layer 410. The second compound semiconductor layer 412 can include one or more compound semiconductors. The one or more compound semiconductors can include at least one element from Group 13 of the periodic table of elements and at least one element from Group 15 of the periodic table of elements. For example, the second compound semiconductor material layer 412 can be an AlGaN barrier layer, in various implementations. The second compound semiconductor layer 412 can also be an AlInGaN barrier layer. A 2-dimensional electron gas (2DEG) layer can be formed at the interface of the first compound semiconductor layer 410 and the second compound semiconductor layer 412 that enables the flow of electrons through the 2DEG. The nucleation layer 408, the first compound semiconductor layer 410, and the second compound semiconductor layer 412 can comprise a semiconductor layer 414 that can be used to form one or more semiconductor devices, such as transistors. In illustrative examples, the 2DEG layer can be formed at an interface of a first compound semiconductor layer 410 that is comprised of GaN and a second compound semiconductor layer 412 comprised of AlGaN.

A first dielectric layer 416 can be disposed on the second compound semiconductor layer 412. The first dielectric layer 416 can include a SiN-containing material. Additionally, a gate electrical contact 418 can be disposed over a gate region of the second compound semiconductor layer 412. The gate electrical contact 418 can include one or more suitable metallic materials. For example, the gate electrical contact 418 can include a titanium nitride (TiN)/Al material. The gate electrical contact 418 can also include a nickel (Ni)/gold (Au) material.

Further, a source electrical contact 420 can be disposed over a source region of the semiconductor layer 414 and a drain electrical contact 422 can be disposed over a drain region of the semiconductor layer 414. The source electrical contact 420 and the drain electrical contact 422 can include one or more suitable metallic materials. To illustrate, the source electrical contact 420 and the drain electrical contact 422 can include a Ti/Al material. In additional illustrative examples, the source electrical contact 420 and the drain electrical contact 422 can include a Ti/Au metallic material. A first conductive layer contact 424 can electrically couple the source electrical contact 420 with the first conductive layer 404. A second conductive layer contact 426 can electrically couple the drain electrical contact 422 with the second conductive layer 406.

At least one additional dielectric layer 428 can be disposed over the gate electrical contact 418. Further, at least a portion of the source electrical contact 420 and at least a portion of the drain electrical contact 422 can be disposed within the at least one additional dielectric layer 428. The at least one additional dielectric layer 428 can include a $SiO_2$ material, in some implementations. The at least one additional dielectric layer 428 can also include a $Si_2N_3$ material.

Although not shown in the illustrative example of FIG. 4, the integrated circuit 400 can include additional electronic components. For example, the integrated circuit 400 can include one or more resistors. In addition, the integrated circuit 400 can include one or more capacitors. Further, the integrated circuit 400 can include one or more field plates disposed on or within one or more of the dielectric layers 416, 428. The integrated circuit 400 can also include one or more inductors. In various examples, the integrated circuit 400 can include one or more interconnect devices.

Figure 5:
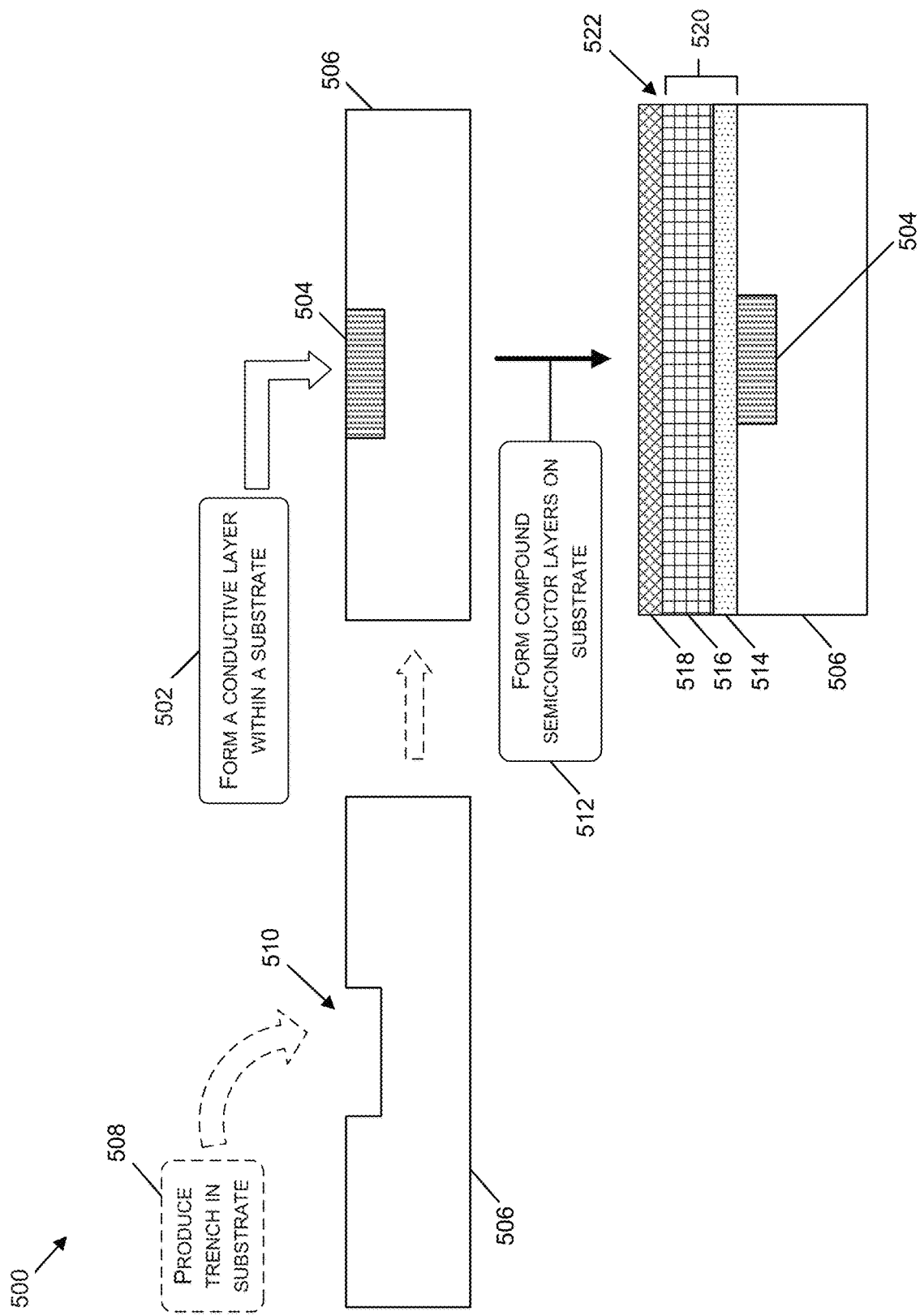
FIG. 5 is a diagram depicting a first example process to form one or more conductive layers in a substrate on which a compound semiconductor layer is disposed.

FIG. 5 is a diagram depicting a first example process 500 to form one or more conductive layers in a substrate on which a compound semiconductor layer is disposed. For example, at operation 502, a conductive layer 504 can be formed within a substrate 506. The conductive layer 504 can be formed by implantation of a conducting material into the substrate 506. After implantation, the conducting material that comprises the conductive layer 504 can be activated. A polishing operation can also be performed with respect to a top surface of the substrate 506 after implantation and activation to form the conductive layer 504. The conductive layer 504 can be formed at one or more depths within the substrate 506.

The conductive layer 504 can include a GaN-containing material, in some implementations. For example, the conductive layer 504 can include at least one of a GaN-containing material with an n-type dopant or a GaN-containing material with a p-type dopant. Additionally, the conductive layer 504 can include an Si-containing material. To illustrate, the conductive layer 504 can include at least one of an Si-containing material with an n-type dopant or an Si-containing material with a p-type dopant. Further, the conductive layer 504 can include a Ge-containing material. In illustrative examples, the conductive layer 504 can include at least one of a Ge-containing material with a p-type dopant or a Ge-containing material with an n-type dopant.

In alternative implementations, instead of forming the conductive layer 504 via implantation and activation, the process 500 can include, at 508, producing a trench 510 is produced in the substrate 506. The trench 510 can be produced by removing a portion of the substrate 506. For example, the trench 510 can be produced using one or more etching operations. In illustrative examples, the substrate 506 can be an SiC substrate and the trench 510 can be formed by etching the substrate 506 using hydrofluoric acid in the presence of a platinum (Pt) catalyst. Additionally, in situations where the substrate 506 is an SiC substrate, the trench 510 can be formed by etching the substrate 506 using inductively coupled plasma etching. In various examples, a masking layer can be formed on the substrate 506 and patterned according to the location of the trench 510 before the etching of the substrate 506 to form the trench 510 takes place. After the mask layer is patterned, the portion of the substrate 506 that corresponds to the trench 510 can then be removed.

After the trench 510 is formed in the substrate 506, the conductive layer 504 can be formed in the trench 510. In various implementations, the conductive layer 504 can be formed in the trench 510 using one or more techniques used to form the conductive layer 504 without the trench 510, as described previously. For example, the conductive layer 504 can be implanted into the trench 510. The conductive layer 504 can also be grown in the trench 510. For example, one or more chemical vapor deposition techniques can be used to form the conductive layer 504 in the trench 510. Additionally, the conductive layer 504 can be grown in the trench 510 using one or more epitaxial techniques. In scenarios where the conductive layer 504 is a GaN-containing layer, the conductive layer 504 can be formed in the trench 510 using metal-organic chemical vapor deposition. Additionally, a GaN-containing conductive layer 504 can be formed in the trench 510 using molecular beam epitaxy. Further, a GaN-containing conductive layer 504 can be formed in the trench 510 using hybrid vapor phase epitaxy. In various implementations, one or more etching operations, one or more cleaning operations, and/or one or more rinsing operations can take place before forming the conductive layer 504 in the trench 510. In illustrative examples, a surface of the substrate 506 and the conductive layer 504 can be subjected to one or more chemical mechanical polishing (CMP) operations.

At operation 512, one or more compound semiconductor layers can be formed on the substrate 506 and over the conductive layer 504. To illustrate, a nucleation layer 514 can be formed on the substrate 506 and a first compound semiconductor layer 516 can be formed on the nucleation layer 514. In addition, a second compound semiconductor layer 518 can be formed on the first compound semiconductor layer 516. In illustrative examples, the first compound semiconductor layer 516 and the second compound semiconductor layer 518 can be formed on the nucleation layer 514 using a metal-organic chemical vapor deposition process. Further, the first compound semiconductor layer 516 can be formed on the nucleation layer 514 using molecular beam epitaxy.

The first compound semiconductor layer 516 can comprise a channel layer and the second compound semiconductor layer 518 can comprise a barrier layer. In one or more illustrative examples, the first compound semiconductor layer 516 can comprise a GaN-containing channel layer. Additionally, the second compound semiconductor layer 518 can comprise an AlGaN-containing barrier layer.

The conductive layer 504 can be formed such that a distance 520 between a top surface of the conductive layer 504 and an interface 522 of the first compound semiconductor layer 516 and the second compound semiconductor layer 518 is minimized. In illustrative examples, the thickness of the first compound semiconductor layer 516 can be controlled in order to minimize the distance 520 between the top surface of the conductive layer 504 and the interface 522 between the first compound semiconductor layer 516 and the second compound semiconductor layer 518. In illustrative examples, the distance 520 can be no greater than about 1000 nanometers, no greater than about 800 nanometers, no greater than about 600 nanometers, no greater than about 500 nanometers, no greater than about 400 nanometers, no greater than about 300 nanometers, no greater than about 200 nanometers, or no greater than about 100 nanometers. For example, the distance 520 between the conductive layer 504 and the interface 522 can be from about 50 nm to about 1000 nm, from about 50 nm to about 500 nm, from about 50 nm to about 200 nm, from about 100 nm to about 500 nm, from about 200 nm to about 500 nm, or from about 100 nm to about 300 nm.

Figure 6:
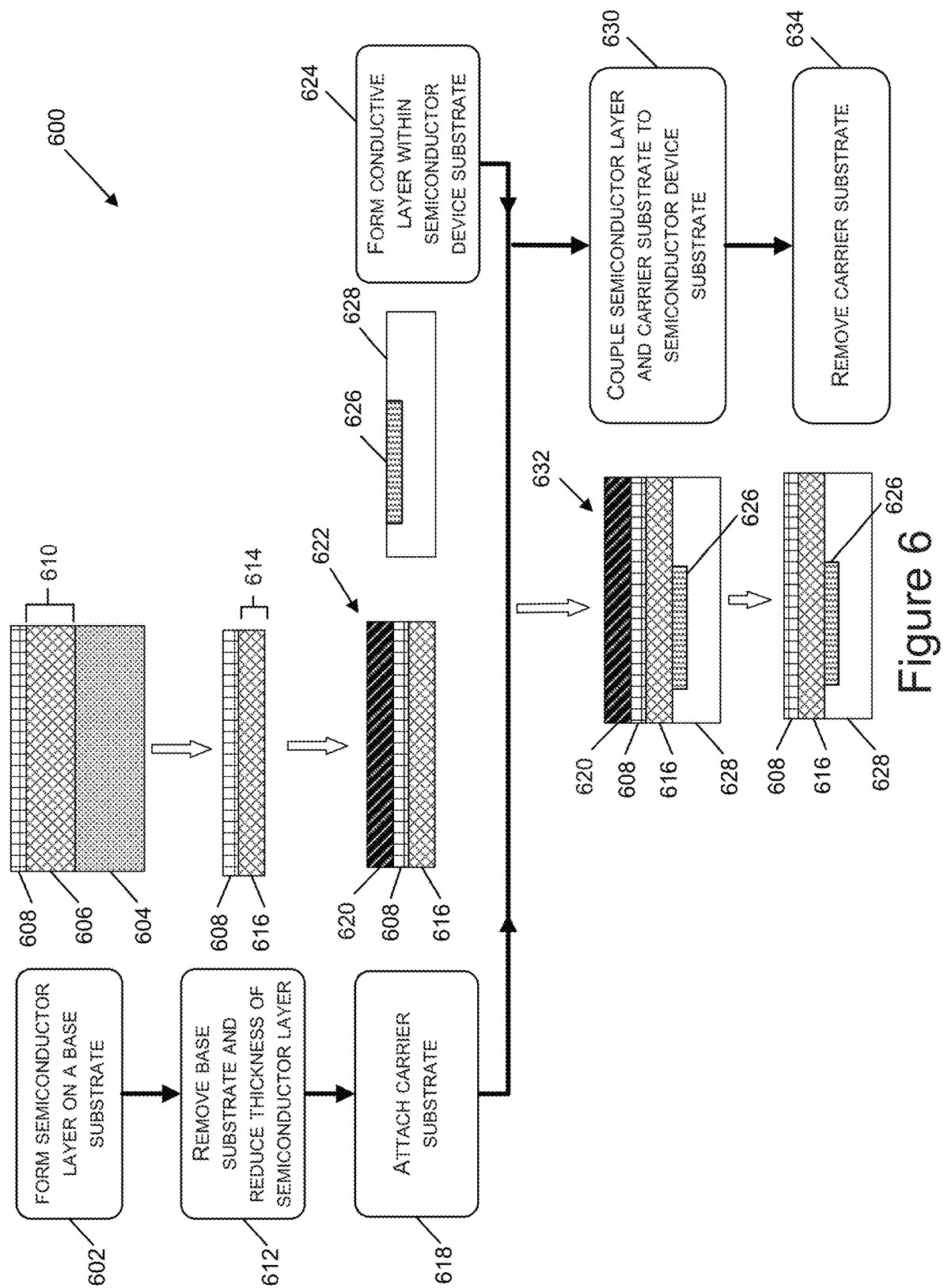
FIG. 6 is a diagram depicting a second example process to form one or more conductive layers in a substrate on which a compound semiconductor layer is disposed.

FIG. 6 is a diagram depicting a second example process 600 to form one or more conductive layers in a substrate on which a compound semiconductor layer is disposed. At operation 602, the compound semiconductor layer can be formed on a base substrate 604. The base substrate 604 can include a Si-containing substrate. The base substrate 604 can have a thickness from about 500 micrometers to about 1200 micrometers or from about 600 micrometers to about 800 micrometers. The compound semiconductor material layer formed on the base substrate 604 can be produced using one or more metal-organic chemical vapor deposition processes. Additionally, the compound semiconductor material layer formed on the base substrate 604 can be produced using one or more epitaxy techniques, such as molecular beam epitaxy.

The compound semiconductor layer formed on the base substrate 604 can include a first compound semiconductor layer 606 and a second compound semiconductor layer 608. The first compound semiconductor material 606 can include a GaN-containing channel layer. In addition, the second compound semiconductor layer 608 can include a barrier layer. The second compound semiconductor layer 608 can be an AlGaN layer. In addition, the second compound semiconductor layer 608 can be an AlInGaN layer. The first compound semiconductor layer 606 can have a first thickness 610. In illustrative examples, the first compound semiconductor layer 606 can include a first portion that is proximate to the base substrate 604 and is configured as a buffer portion. The first compound semiconductor layer 606 can also include a second portion that is proximate to the second compound semiconductor layer 608 and is configured as a channel portion. The first thickness 610 of the first compound semiconductor material layer 606 can be from about 1000 nanometers to about 3000 nanometers, from about 1000 nanometers to about 2000 nanometers, or from about 1500 nanometers to about 3000 nanometers.

At operation 612, the process 600 can include removing the base substrate 604 from the compound semiconductor layer and reducing the thickness of the first compound semiconductor layer 606. The base substrate 604 can be separated from the first compound semiconductor layer 606 using one or more chemical processes. Further, the base substrate 604 can be separated from the first compound semiconductor layer 606 using one or more mechanical processes. The separation of the base substrate 604 from the first compound semiconductor layer 606 can also include the removal of one or more layers disposed between the first compound semiconductor layer 606 and the base substrate 604. For example, a nucleation layer disposed between the base substrate 604 and the first compound semiconductor layer 606 can be removed. Additionally, one or more buffer layers disposed between the base substrate 604 and the first compound semiconductor layer 606 can also be removed.

Additionally, the thickness 610 of the first compound semiconductor layer 606 can be reduced from the first thickness 610 to a second thickness 614 and a modified first compound semiconductor layer 616 can be produced. The modified first compound semiconductor layer 616 can be configured as a channel layer in a compound semiconductor device. The thickness of the first compound semiconductor layer 606 can be reduced from the first thickness 610 to the second thickness 614 using one or more chemical processes. The thickness of the first compound semiconductor layer 606 can also be reduced from the first thickness 610 to the second thickness 614 using one or more mechanical processes. In illustrative examples, the thickness of the first compound semiconductor layer 606 can be reduced to the second thickness 614 using one or more etching processes. For example, a plasma etching process can be used to reduce the thickness of the first compound semiconductor layer 606 from the first thickness 610 to the second thickness 614. One or more chemical mechanical polishing operations can also be used to reduce the thickness of the first compound semiconductor layer 606 to the second thickness 614. In various examples, the thickness of the first compound semiconductor layer 606 can be reduced from the first thickness 610 to the second thickness 614 using an inductively coupled plasma etching process that is followed by chemical mechanical polishing. The second thickness 614 of the modified first compound semiconductor layer 616 can be from about 400 nm to about 1200 nm, from about 500 nm to about 1000 nm, from about 400 nm to about 800 nm, from about 200 nm to about 800 nm, or from about 200 nm to about 500 nm.

The process 600 can also include, at operation 618, attaching a carrier substrate 620 to the second compound semiconductor layer 608. The combination of the carrier substrate 620 and the modified compound semiconductor layer, which is comprised of the second compound semiconductor layer 608 and the modified first compound semiconductor layer 616, can make up a first intermediate substrate assembly 622. The carrier substrate 620 can comprise a sapphire-containing substrate. In additional examples, the carrier substrate 620 can comprise, a polycrystalline-AlN containing substrate. Further, the carrier substrate 620 can comprise an SiC-containing substrate. The carrier substrate 620 can be coupled to the second compound semiconductor layer 608 using one or more bonding layers. The one or more bonding layers can include one or more adhesives, in some implementations. In addition, the one or more bonding layers can include one or more dielectric materials.

In addition, the process 600 can include, at operation 624, forming a conductive layer 626 within a semiconductor device substrate 628. The semiconductor device substrate 628 can include an Si-containing substrate. The semiconductor device substrate 628 can also include an SiC-containing substrate. Further, the semiconductor device substrate 628 can include a sapphire substrate. In one or more implementations, the semiconductor device substrate 628 can include an AlN substrate. For example, the semiconductor device substrate 628 can include a polycrystalline AlN substrate.

In various implementations, the conductive layer 626 can be implanted into the semiconductor device substrate 628. In addition, the conductive layer 626 can also be grown in the semiconductor device substrate 628. For example, one or more chemical vapor deposition techniques can be used to form the conductive layer 626 in the semiconductor device substrate 628. The conductive layer 626 can also be grown in the semiconductor device substrate 628 using one or more epitaxial techniques. In various implementations, one or more etching operations, one or more cleaning operations, and/or one or more rinsing operations can be performed with respect to the semiconductor device substrate 628 before forming the conductive layer 626. In illustrative examples, after the conductive layer 626 is formed in the semiconductor device substrate 628, a surface of the semiconductor device substrate 628 and/or a surface of the conductive layer 626 can be subjected to one or more chemical mechanical polishing (CMP) operations.

The conductive layer 626 can include an SiC-containing material, in some implementations. For example, the conductive layer 626 can include at least one of an SiC-containing material with an n-type dopant or an SiC-containing material with a p-type dopant. Additionally, the conductive layer 626 can include an Si-containing material. To illustrate, the conductive layer 626 can include at least one of an Si-containing material with an n-type dopant or an Si-containing material with a p-type dopant. Further, the conductive layer 626 can include a Ge-containing material. In illustrative examples, the conductive layer 626 can include at least one of a Ge-containing material with a p-type dopant or a Ge-containing material with an n-type dopant.

At operation 630, the first intermediate substrate assembly 622 can be coupled to the semiconductor device substrate 628 to produce a second intermediate substrate assembly 632. One or more bonding layers can be used to couple the semiconductor device substrate 628 to the first intermediate substrate assembly 622. In illustrative examples, the semiconductor device substrate 628 with the conductive layer 626 can be coupled to the modified first compound semiconductor material layer 616 using the one or more bonding layers. The one or more bonding layers can include one or more adhesives. For example, the one or more bonding layers used to couple the first intermediate substrate assembly 622 to the semiconductor device substrate 528 can include SiN. The first intermediate assembly 622 can be coupled to the semiconductor device substrate 628 by depositing one or more layers of SiN on at least one of the first intermediate substrate assembly 622 or the semiconductor device substrate 628 and performing plasma activation with respect to the one or more SiN layers before coupling the first intermediate substrate assembly 622 to the semiconductor device substrate 628.

Additionally, the process 600 can include, at operation 634, removing the carrier substrate 620 from the second intermediate substrate assembly 632. For example, the carrier substrate 620 can be decoupled from the second compound semiconductor layer 608. The carrier substrate 620 can be removed from the second intermediate substrate assembly 632 using one or more chemical processes. The carrier substrate 620 can also be removed from the second intermediate substrate assembly 632 using one or more mechanical processes. In illustrative examples, the carrier substrate 620 can be separated from the second compound semiconductor layer 608 by removing one or more bonding layers that coupled the carrier substrate 620 to the second compound semiconductor layer 608.

Although not shown in the illustrative example of FIG. 6, a compound semiconductor device that includes the second compound semiconductor layer 608, the modified first compound semiconductor layer 616, the conductive layer 626, and the semiconductor device substrate 628 can also include one or more additional layers. For example, compound semiconductor material device produced according to the process 600 can include a nucleation layer between the semiconductor device substrate 628 and the modified first compound semiconductor layer 616. Also, a compound semiconductor material device produced according to the process 600 can include an adhesive layer between the semiconductor device substrate 628 and the modified first compound semiconductor layer 616.

The semiconductor layers comprised of at least the modified first compound semiconductor layer 616 and the second compound semiconductor layer 608 can be used to form one or more semiconductor devices, such as one or more transistors. The conductive layer 626 can function as a back-side field plate with respect to one or more transistors formed from the modified first compound semiconductor layer 616 and the second compound semiconductor layer 608. Additional electronic components can also be formed to produce one or more integrated circuits that can be placed into an electronic device. To illustrate, one or more capacitors, one or more inductors, one or more resistors, one or more electrical contacts, one or more connectors, one or more field plates, or one or more combinations thereof, can be formed in addition to the one or more transistors formed from the second compound semiconductor layer 608 and the modified first compound semiconductor layer 616. The one or more integrated circuits that include one or more transistors formed from the second compound semiconductor layer 608 and the modified first compound semiconductor layer 616 can comprise at least one of radio frequency integrated circuits, monolithic microwave integrated circuits, or power switching integrated circuits.

Figure 7:
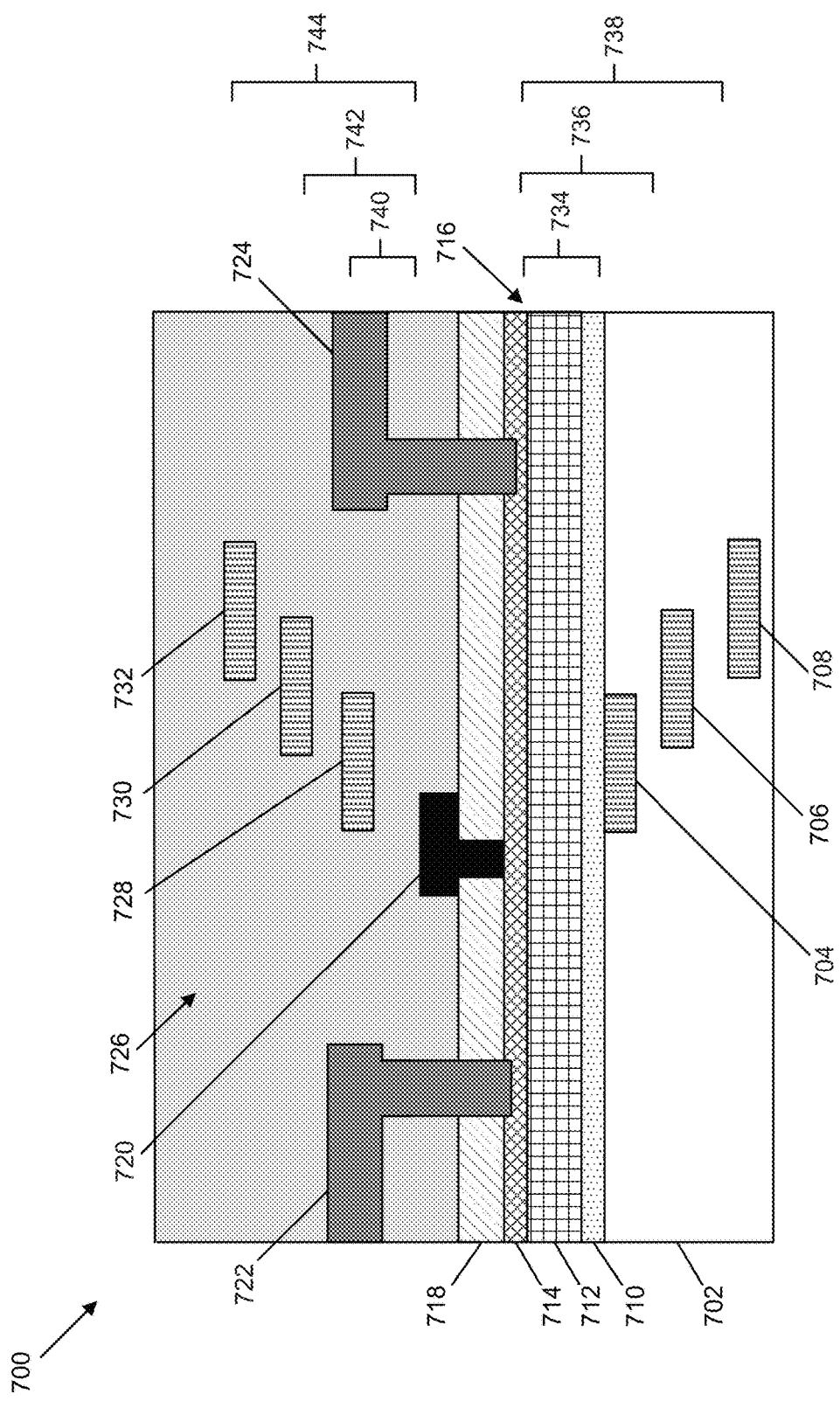
FIG. 7 is a diagram depicting a cross-section of at least a portion of components of an example integrated circuit including a compound semiconductor device having a plurality of conductive layers to modify an electric field produced by the compound semiconductor device.

FIG. 7 is a diagram depicting a cross-section of at least a portion of components of an example integrated circuit 700 including a compound semiconductor device having a plurality of conductive layers to modify an electric field produced by the compound semiconductor device. The integrated circuit 700 can include a substrate 702. In illustrative examples, the substrate 702 can be an SiC-containing substrate. The substrate 702 can also include an Si-containing substrate. Further, the substrate 702 can include a sapphire substrate. A thickness of the substrate 702 can be from about 100 micrometers to about 800 micrometers, from about 200 micrometers to about 700 micrometers, or from about 300 micrometers to about 600 micrometers.

A plurality of conductive layers can be disposed within the substrate 702. The plurality of conductive layers can be disposed in a staircase arrangement with individual conductive layers being offset laterally with respect to additional conductive layers of the plurality of conductive layers. The illustrative example of FIG. 7 includes a first conductive layer 704, a second conductive layer 706, and a third conductive layer 708 disposed within the substrate 702. The first conductive layer 704 can comprise a portion of a surface of the substrate 702. Additionally, the first conductive layer 704 can be disposed beneath a surface of the substrate 702. The first conductive layer 704 and the second conductive layer 706 are offset with respect to each other by a first offset amount and the second conductive layer 706 and the third conductive layer 708 are offset with respect to each other by a second offset amount. The first offset amount and the second offset amount can be at least substantially the same. In addition, the first offset amount and the second offset amount can be different. The first conductive layer 704, the second conductive layer 706, and the third conductive layer 708 can also be located at different depths within the substrate 702. The conductive layers 704, 706, 708 can be implanted within the substrate 702 in some implementations. Additionally, the conductive layers 704, 706, 708 can be grown within the substrate 702.

The conductive layers 704, 706, 708 can include an n-type material, in some implementations. The conductive layers 704, 706, 708 can also include a p-type material. In illustrative examples, the conductive layers 704, 706, 708 can include an Si-containing material. Additionally, the conductive layers 704, 706, 708 can include a GaN-containing material. The conductive layers 704, 706, 708 can also include a Ge-containing material. Further, the conductive layers 704, 706, 708 can include a polysilicon-containing material. In additional examples, the conductive layers 704, 706, 708 can include an SiC-containing material. In various implementations, the conductive layers 704, 706, 708 can include one or more combinations of an n-type material, a p-type material, an Si-containing material, a GaN-containing material, an SiC-containing material, a Ge-containing material, or a polysilicon-containing material. A thickness of the individual conductive layers 704, 706, 708 can be from about 200 nanometers (nm) to about 1500 nm, from about 300 nm to about 1200 nm, or from about 400 nm to about 1000 nm. In implementations where the conducting layers 704, 706, 708 are comprised of a p-type material, layers of an n-type material can be interspersed between the conducting layers 704, 706, 708. Also, in implementations where the conducting layers 704, 706, 708 are comprised of an n-type material, layers of a p-type material can be interspersed between the conducting layers 704, 706, 708.

The conductive layers 704, 706, 708 can be configured as back-side field plates to shape an electric field produced by a compound semiconductor device of the integrated circuit 700. The individual conductive layers 704, 706, 708 can modify different portions of an electric field produced by a compound semiconductor device of the integrated circuit 700. Additionally, the individual conductive layers 704, 706, 708 can be used to modify electric fields having different strengths. For example, the first conductive layer 704 can modify a first range of electric field strengths, the second conductive layer 706 can modify a second range of electric field strengths, and the third conductive layer 708 can modify a third range of electric field strengths. In an illustrative example, the first conductive layer 704 can modify electrical field strengths from about 1 Volt/meter (V/m) to about 20 V/m, the second conductive layer 706 can modify electrical field strengths from about 20 V/m to about 40 V/m, and the third conductive layer 708 can modify electrical field strengths from about 40 V/m to about 80 V/m.

A nucleation layer 710 can be disposed on the substrate 702 and over the conductive layers 704, 706, 708. The nucleation layer 710 can have a thickness from about 10 nanometers to about 200 nanometers, from about 20 nanometers to about 100 nanometers, or from about 20 nanometers to about 80 nanometers. The nucleation layer 710 can include an AlN-containing material. The nucleation layer 710 can be used to form a first compound semiconductor layer 712. The first compound semiconductor layer 712 can include one or more compound semiconductors. The one or more compound semiconductors can include at least one element from Group 13 of the periodic table of elements and at least one element from Group 15 of the periodic table of elements. For example, the first compound semiconductor layer 712 can include GaN. In addition, the first compound semiconductor layer 712 can include GaAs. Further, the first compound semiconductor layer 712 can include AlN. The first compound semiconductor layer 712 can also include InP.

The first compound semiconductor layer 712 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm. In illustrative examples, the thickness of the first compound semiconductor layer 712 can be less than the thickness of a compound semiconductor layer of conventional compound semiconductor devices.

In addition, a second compound semiconductor layer 714 can be disposed on the first compound semiconductor layer 712. The second compound semiconductor layer 714 can include one or more compound semiconductors. The one or more compound semiconductors can include at least one element from Group 13 of the periodic table of elements and at least one element from Group 15 of the periodic table of elements. For example, the second compound semiconductor layer 714 can be an AlGaN barrier layer, in various implementations. The second compound semiconductor layer 714 can also be an AlInGaN barrier layer. A 2-dimensional electron gas (2DEG) layer can be formed at an interface 716 between the first compound semiconductor layer 712 and the second compound semiconductor layer 714 that enables the flow of electrons through the 2DEG. The nucleation layer 710, the first compound semiconductor layer 712, and the second compound semiconductor layer 714 can comprise a semiconductor layer that can be used to form one or more semiconductor devices, such as transistors. In illustrative examples, the 2DEG layer can be formed at the interface 716 of a first compound semiconductor layer 712 that is comprised of GaN and a second compound semiconductor layer 714 comprised of AlGaN.

A first dielectric layer 718 can be disposed on the second compound semiconductor layer 714. The first dielectric layer 718 can include a SiN-containing material. Additionally, a gate electrical contact 720 can be disposed over a gate region of the second compound semiconductor layer 714. The gate electrical contact 720 can include one or more suitable metallic materials. For example, the gate electrical contact 720 can include a titanium nitride (TiN)/Al material. The gate electrical contact 720 can also include a nickel (Ni)/gold (Au) material.

Further, a source electrical contact 722 can be disposed over a source region of the second compound semiconductor layer 714 and a drain electrical contact 724 can be disposed over a drain region of the second compound semiconductor layer 714. The source electrical contact 722 and the drain electrical contact 724 can include one or more suitable metallic materials. To illustrate, the source electrical contact 722 and the drain electrical contact 724 can include a Ti/Al material. In additional illustrative examples, the source electrical contact 722 and the drain electrical contact 724 can include a Ti/Au metallic material.

At least one additional dielectric layer 726 can be disposed over the gate electrical contact 720. Further, at least a portion of the source electrical contact 722 and at least a portion of the drain electrical contact 724 can be disposed within the at least one additional dielectric layer 726. The at least one additional dielectric layer 726 can include a $SiO_2$ material, in some implementations. The at least one additional dielectric layer 726 can also include a $Si_2N_3$ material.

A fourth conductive layer 728, a fifth conductive layer 730, and a sixth conductive layer 732 can be disposed over the semiconductor layer that comprises at least the nucleation layer 710, the first compound semiconductor layer 712, and the second compound semiconductor layer 714. The conductive layers 728, 730, 732 can also be disposed over the first dielectric layer 618. Further, the conductive layers 728, 730, 732 can be disposed within the at least one additional nucleation layer 726. The conductive layers 728, 730, 732 can function as front side field plates and modify an electric field produced during operation of the integrated circuit 700. The conductive layers 728, 730, 732 can be disposed in a staircase arrangement with individual conductive layers 728, 730, 732 being offset laterally with respect to the other conductive layers 728, 730, 732. The fourth conductive layer 728 and the fifth conductive layer 730 can be offset with respect to each other by a third offset amount and the fifth conductive layer 730 and the sixth conductive layer 732 can be offset with respect to each other by a fourth offset amount. The third offset amount and the fourth offset amount can be at least substantially the same. In addition, the third offset amount and the fourth offset amount can be different. In various examples, the third offset amount can correspond to the first offset amount between the first conductive layer 704 and the second conductive layer 706 and the fourth offset amount can correspond to the second offset amount between the second conductive layer 706 and the third conductive layer 708. The conductive layers 728, 730, 732 can be produced using a growth and activation process.

The conductive layers 728, 730, 732 can be disposed in an arrangement that mirrors the arrangement of the conductive layers 704, 706, 708. In the illustrative example of FIG. 7, a location of the first conductive layer 704 can be arranged to correspond to a location of the fourth conductive layer 728, a location of the second conductive layer 706 can be arranged to correspond to a location of the fifth conductive layer 730, and a location of the third conductive layer 708 can be arranged to correspond to a location of the sixth conductive layer 732. In one or more examples, the first conductive layer 704 can be vertically aligned with the fourth conductive layer 728, the second conductive layer 706 can be vertically aligned with the fifth conductive layer 730, and the third conductive layer 708 can be vertically aligned with the sixth conductive layer 732.

The first conductive layer 704 can be located a first distance 734 from the interface 716 between the first compound semiconductor layer 712 and the second compound semiconductor layer 714. The first distance 734 can be from about 50 nm to about 500 nm, from about 50 nm to about 300 nm, from about 50 nm to about 200 nm, or from about 100 nm to about 300 nm. The second conductive layer 706 can be located a second distance 736 from the interface 716 between the first compound semiconductor layer 712 and the second compound semiconductor layer 714. The second distance 736 can be from about 100 nm to about 800 nm, from about 100 nm to about 500 nm, from about 100 nm to about 300 nm, or from about 200 nm to about 400 nm. Additionally, the third conductive layer 708 can be located a third distance 738 from the interface 716 between the first compound semiconductor layer 712 and the second compound semiconductor layer 714. The third distance 738 can be from about 300 nm to about 2000 nm, from about 500 nm to about 1200 nm, from about 500 nm to about 1000 nm, or from about 800 nm to about 1200 nm.

The fourth conductive layer 728 can be located a fourth distance 740 from the gate electrical contact 720. The fourth distance 734 can be from about 200 nm to about 1000 nm, from about 200 nm to about 800 nm, from about 300 nm to about 1000 nm, or from about 400 nm to about 800 nm. The fifth conductive layer 730 can be located a fifth distance 742 from the gate electrical contact 720. The fifth distance 742 can be from about 400 nm to about 1500 nm, from about 400 nm to about 1000 nm, from about 500 nm to about 1200 nm, or from about 800 nm to about 1500 nm. Additionally, the sixth conductive layer 732 can be located a sixth distance 744 from the gate electrical contact 720. The sixth distance 744 can be from about 600 nm to about 1800 nm, from about 600 nm to about 1500 nm, from about 800 nm to about 2000 nm, or from about 1200 nm to about 2000 nm.

Although not shown in the illustrative example of FIG. 7, the integrated circuit 700 can include additional electronic components. For example, the integrated circuit 700 can include one or more resistors. In addition, the integrated circuit 700 can include one or more capacitors. Further, the integrated circuit 700 can include one or more field plates disposed on or within one or more of the dielectric layers 718, 726. The integrated circuit 700 can also include one or more inductors. In various examples, the integrated circuit 700 can include one or more interconnect devices.

Furthermore, although not shown in the illustrative example of FIG. 7, the conductive layers 704, 706, 708 can be coupled to the drain electrical contact 724. In addition, although the conductive layers 704, 706, 708 are shown located under at least a portion of the gate electrical contact 720 and under at least a portion of the drain electrical contact 724 in the illustrative example of FIG. 7, the conductive layers 704, 706, 708 can also be disposed in other locations. For example, the conductive layers 704, 706, 708 can be located under at least a portion of the gate electrical contact 724 and the source electrical contact 722. In these situations, the conductive layers 704, 706, 708 can be coupled to the source electrical contact 722.

In addition, although not shown in the illustrative example of FIG. 7, the conductive layers 728, 730, 732 can be coupled to the drain electrical contact 724. In addition, although the conductive layers 728, 730, 732 are shown located over at least a portion of the gate electrical contact 720 and over at least a portion of the drain electrical contact 724 in the illustrative example of FIG. 7, the conductive layers 728, 730, 732 can also be disposed in other locations. For example, the conductive layers 728, 730, 732 can be located over at least a portion of the gate electrical contact 724 and over the source electrical contact 722. In these situations, the conductive layers 728, 730, 732 can be coupled to the source electrical contact 722.

Figure 8:
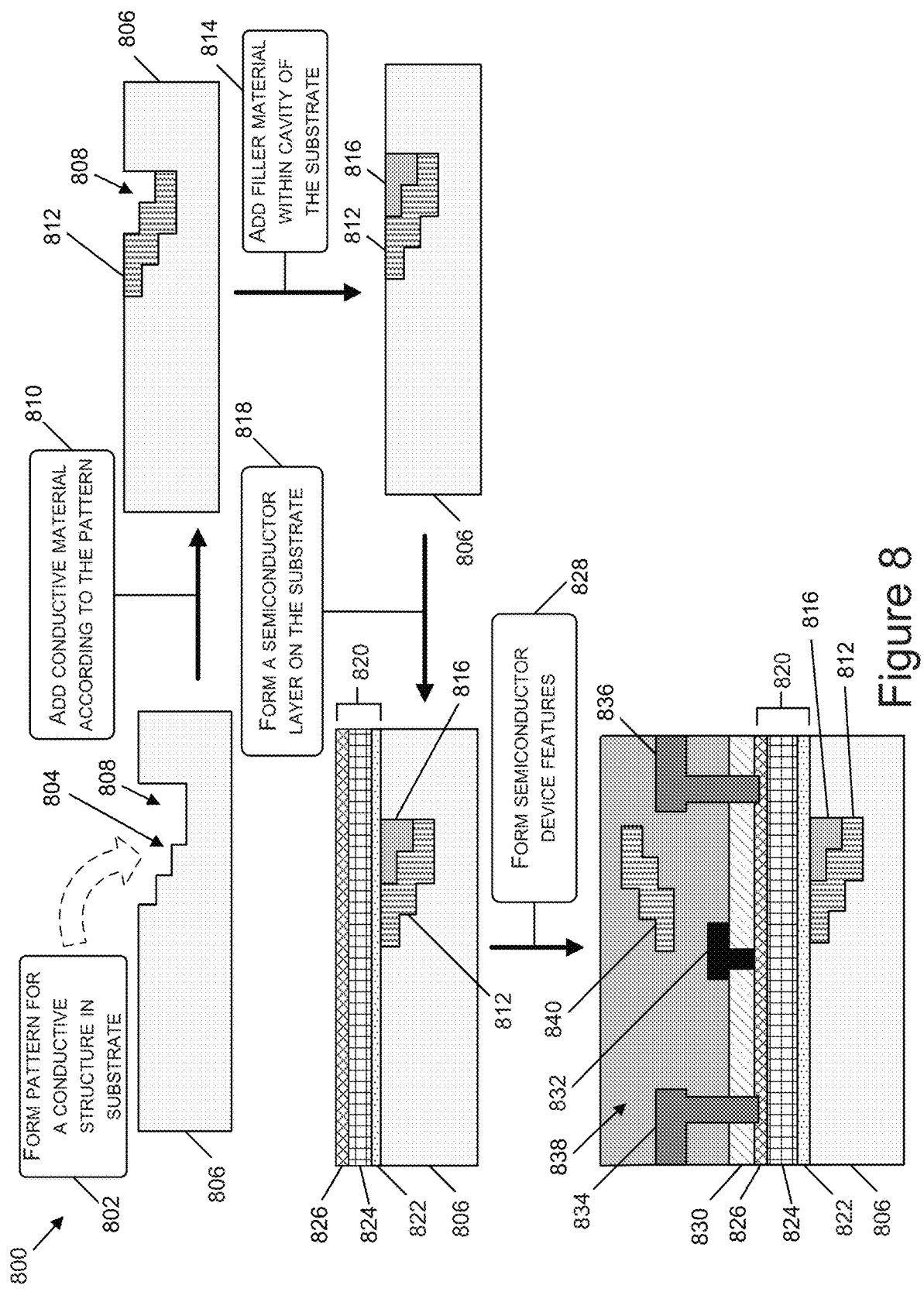
FIG. 8 is a diagram depicting an example process to produce a conducting structure having a staircase arrangement within a substrate on which a compound semiconductor device is disposed.

FIG. 8 is a diagram depicting an example process 800 to produce a conductive structure having a staircase arrangement within a substrate on which a compound semiconductor device is disposed. The process 800 can include, at operation 802, forming a pattern 804 for a conductive structure in a substrate 806. In the illustrative example of FIG. 8, the pattern 804 can have a staircase shape. The pattern 804 can be formed by removing a portion of the material that comprises the substrate 806 according to a shape that corresponds to the pattern 804. For example, a cavity 808 can be produced with one or more edges of the cavity being formed according to the pattern 804. The cavity 808 can be produced using one or more chemical processes, one or more mechanical processes, or a combination of one or more chemical processes and one or more mechanical processes. To illustrate, the cavity 808 can be produced by one or more etching processes. In various examples, the cavity 808 having the pattern 804 can be produced using one or more patterning processes in combination with one or more etching processes. In addition, the cavity 808 can be formed using one or more chemical mechanical polishing processes. The substrate 806 can include an Si-containing substrate. In one or more examples, the substrate 806 can include an SiC-containing substrate. In additional examples, the substrate 806 can include a sapphire substrate. Further, the substrate 806 can include an AlN-containing substrate. To illustrate, the substrate 806 can include a polycrystalline AlN-containing substrate.

At operation 810, the process 800 can include adding conductive material into the cavity 808 according to the pattern 804. By adding conductive material into the cavity 808 according to the pattern 804, a conductive structure 812 can be produced. The conductive structure 812 can have a staircase shape. For example, the conductive structure 812 can include a number of individual steps that are offset laterally and descend vertically into the cavity 808 from a top surface of the substrate 806. The conductive material can be disposed into the cavity 808 by using one or more deposition processes. In one or more illustrative examples, the conductive material can be disposed into the cavity 808 to form the conductive structure 812 using one or more chemical vapor deposition processes. In additional examples, the conductive material can be disposed into the cavity 808 to form the conductive structure 812 using one or more physical vapor deposition processes. In further examples, the conductive material can be disposed into the cavity 808 to form the conductive structure 812 using one or more molecular beam epitaxy processes. The conductive structure 812 can include a GaN-containing material. The conductive structure 812 can also include a Ge-containing material. Further, the conductive structure 812 can include a polysilicon-containing material. In additional examples, the conductive structure 812 can include an SiC-containing material. In various implementations, the conductive structure 812 can include one or more combinations of an n-type material, a p-type material, an Si-containing material, a GaN-containing material, an SiC-containing material, a Ge-containing material, or a polysilicon-containing material. The process 800 can also include, at operation 814, adding filler material 816 within the cavity 808 of the substrate 806. The filler material 816 can include a dielectric material. For example, the filler material 816 can include an SiN-containing material.

Further, at operation 818, the process 800 can include forming a semiconductor layer 820 on the substrate 806. The semiconductor layer 820 can include a nucleation layer 822. The nucleation layer 822 can include an AlN-containing material. The semiconductor layer 820 can also include a first compound semiconductor layer 824. The first compound semiconductor layer 824 can include one or more compound semiconductors. The one or more compound semiconductors can include at least one element from Group 13 of the periodic table of elements and at least one element from Group 15 of the periodic table of elements. The first compound semiconductor layer 824 can comprise a channel layer. For example, the first compound semiconductor layer 824 can include GaN. In addition, the first compound semiconductor layer 824 can include GaAs. Further, the first compound semiconductor layer 824 can include AlN. The first compound semiconductor layer 824 can also include InP. Further, the semiconductor layer 820 can include a second compound semiconductor layer 826. In one or more illustrative examples, the second compound semiconductor material layer 826 can include one or more compound semiconductors. The one or more compound semiconductors can include at least one element from Group 13 of the periodic table of elements and at least one element from Group 15 of the periodic table of elements. For example, the second compound semiconductor layer 826 can be an AlGaN barrier layer, in various implementations. The second compound semiconductor layer 826 can also be an AlInGaN barrier layer.

At operation 828, the process 800 can include forming semiconductor device features. For example, features of one or more transistors can be formed using the semiconductor layer 820. In one or more illustrative examples, a high electron mobility transistor (HEMT) can be formed using the semiconductor layer 820. In various examples, the conductive structure 812 can modify an electric field produced by a transistor formed using the semiconductor layer 820. In this way, the conductive structure 812 can be a backside field plate with respect to a transistor formed using the semiconductor layer 820.

The semiconductor device features can be formed by disposing a first dielectric layer 830 on the second compound semiconductor material layer 826. The first dielectric layer 830 can include a SiN-containing material. Additionally, a gate electrical contact 832 can be disposed over a gate region of the semiconductor layer 820. The gate electrical contact 832 can include one or more suitable metallic materials. For example, the gate electrical contact 832 can include a titanium nitride (TiN)/Al material. The gate electrical contact 832 can also include a nickel (Ni)/gold (Au) material.

Further, a source electrical contact 834 can be disposed over a source region of the semiconductor layer 820 and a drain electrical contact 836 can be disposed over a drain region of the semiconductor layer 820. The source electrical contact 834 and the drain electrical contact 836 can include one or more suitable metallic materials. To illustrate, the source electrical contact 834 and the drain electrical contact 836 can include a Ti/Al material. In additional illustrative examples, the source electrical contact 834 and the drain electrical contact 836 can include a Ti/Au metallic material. The conductive structure 812 can be coupled to the drain electrical contact 836. In additional examples, the conductive structure 812 can be coupled to the source electrical contact 834. In situations where the conductive structure 812 is coupled to the source electrical contact 834, the conductive structure 812 can be located proximate to the source electrical contact 834.

At least one additional dielectric layer 838 can be disposed over the gate electrical contact 832. Further, at least a portion of the source electrical contact 834 and at least a portion of the drain electrical contact 836 can be disposed within the at least one additional dielectric layer 838. The at least one additional dielectric layer 838 can include a SiO$_2$ material, in some implementations. The at least one additional dielectric layer 838 can also include a Si$_2$N$_3$ material.

An additional conductive structure 840 can be disposed within at least a portion of the at least one additional dielectric layer 838. The additional conductive structure 840 can function as a front side field plate and modify an electric field produced by a transistor formed using the semiconductor layer 820. The additional conductive structure 840 can be disposed above the conductive structure 812 such that the conductive structure 812 and the additional conductive structure 840 are aligned vertically. The additional conductive structure 840 can have a same or similar staircase configuration as the conductive structure 812. Additionally, the additional conductive structure 840 can have a configuration that mirrors the configuration of the conductive structure 812. For example, the conductive structure 812 is located below the semiconductor layer 820 and can have a configuration such that the offset layers of the conductive structure 812 are descending and to the right with respect to the semiconductor layer 820. In these scenarios, the additional conductive structure 840 can have offset layers that are located above the semiconductor layer 820 and are ascending and to the right with respect to the semiconductor layer 820. In additional examples not shown in FIG. 8, the conductive structure 812 can be located below the semiconductor layer 820 and have a configuration such that the offset layers of the conductive structure 812 are descending and to the left with respect to the semiconductor layer 820. In these situations, the conductive structure 812 can be located proximate to the source electrical contact 834 rather than proximate to the drain electrical contact 836, as shown in FIG. 8. Further, in the scenarios where the conductive structure 812 is located below the semiconductor layer 820 and has a configuration such that the offset layers of the conductive structure 812 are descending and to the left with respect to the semiconductor layer 820, the additional conductive structure 840 can have offset layers that are located above the semiconductor layer 820, proximate to the source electrical contact 834, and are ascending and to the left with respect to the semiconductor layer 820. The additional conductive structure 840 can be coupled to the drain electrical contact 836. In additional examples the additional conductive structure 840 can be coupled to the source electrical contact 834.

Figure 9:
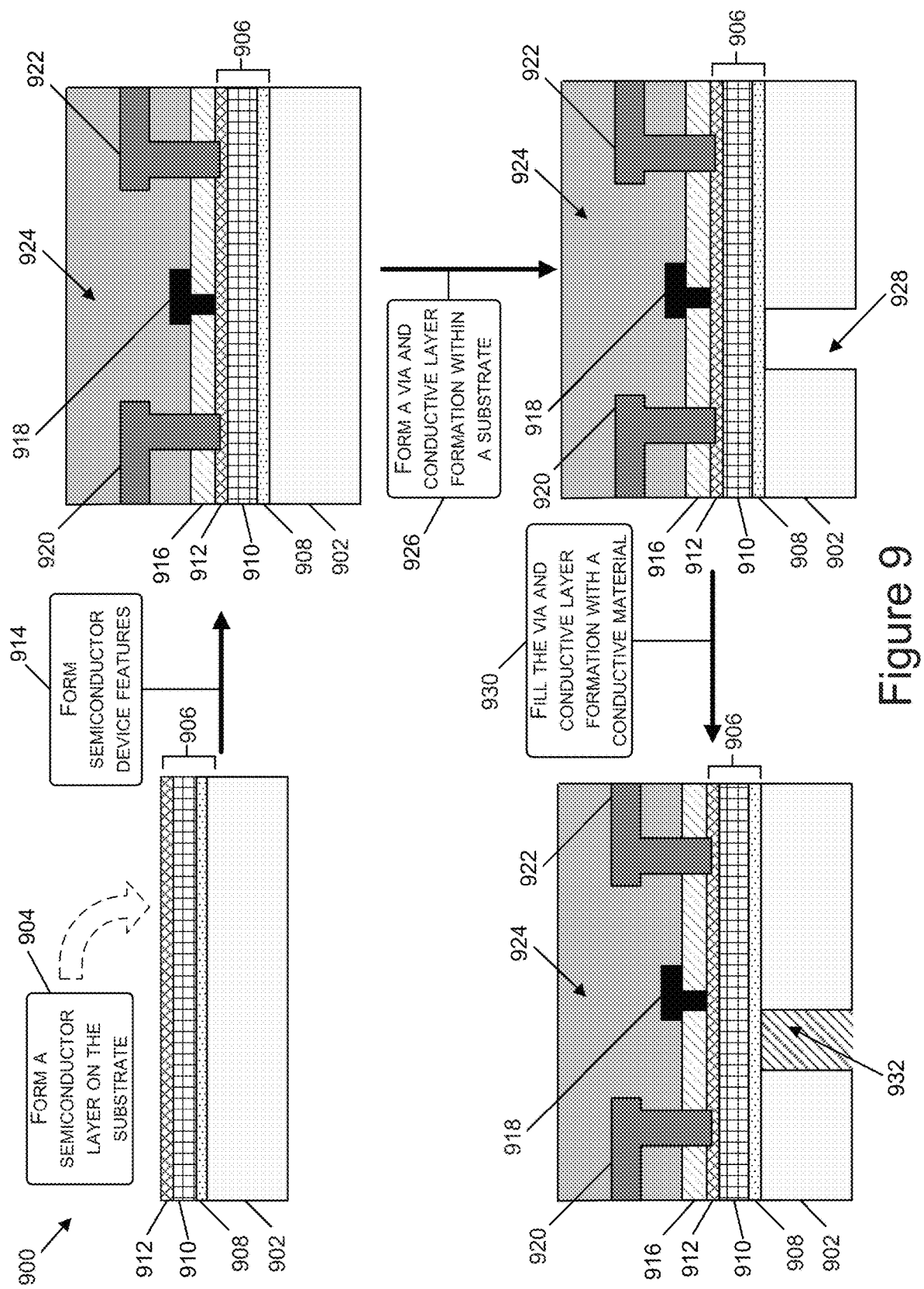
FIG. 9 is a diagram depicting an example process to produce a conductive structure in a substrate by forming a via in the substrate, where a compound semiconductor device is disposed on the substrate.

FIG. 9 is a diagram depicting an example process 900 to produce a conductive structure in a substrate 902 by forming a via in the substrate 902, where a compound semiconductor device is disposed on the substrate 902. The process 900 can include, at operation 904, forming a semiconductor layer 906 on the substrate 902. The semiconductor layer 906 can include a nucleation layer 908. The nucleation layer 908 can include an AlN-containing material. The semiconductor layer 906 can also include a first compound semiconductor layer 910. The first compound semiconductor layer 910 can include one or more compound semiconductors. The one or more compound semiconductors can include at least one element from Group 13 of the periodic table of elements and at least one element from Group 15 of the periodic table of elements. The first compound semiconductor layer 910 can comprise a channel layer. For example, the first compound semiconductor layer 910 can include GaN. In addition, the first compound semiconductor layer 910 can include GaAs. Further, the first compound semiconductor layer 910 can include AlN. The first compound semiconductor layer 910 can also include InP. Further, the semiconductor layer 906 can include a second compound semiconductor layer 912. In one or more illustrative examples, the second compound semiconductor layer 912 can include one or more compound semiconductors. The one or more semiconductors can include at least one element from Group 13 of the periodic table of elements and at least one element from Group 15 of the periodic table of elements. For example, the second compound semiconductor layer 912 can be an AlGaN barrier layer, in various implementations. The second compound semiconductor layer 912 can also be an AlInGaN barrier layer.

At operation 914, the process 900 can include forming semiconductor device features. For example, features of one or more transistors can be formed using the semiconductor layer 906. In one or more illustrative examples, a high electron mobility transistor (HEMT) can be formed using the semiconductor layer 906. The semiconductor device features can be formed by disposing a first dielectric layer 916 on the second compound semiconductor material layer 912. The first dielectric layer 916 can include a SiN-containing material. Additionally, a gate electrical contact 918 can be disposed over a gate region of the semiconductor layer 906. The gate electrical contact 918 can include one or more suitable metallic materials. For example, the gate electrical contact 918 can include a titanium nitride (TiN)/Al material. The gate electrical contact 918 can also include a nickel (Ni)/gold (Au) material.

Further, a source electrical contact 920 can be disposed over a source region of the semiconductor layer 906 and a drain electrical contact 922 can be disposed over a drain region of the semiconductor layer 906. The source electrical contact 920 and the drain electrical contact 922 can include one or more suitable metallic materials. To illustrate, the source electrical contact 920 and the drain electrical contact 922 can include a Ti/Al material. In additional illustrative examples, the source electrical contact 920 and the drain electrical contact 922 can include a Ti/Au metallic material.

At least one additional dielectric layer 924 can be disposed over the gate electrical contact 918. Further, at least a portion of the source electrical contact 920 and at least a portion of the drain electrical contact 922 can be disposed within the at least one additional dielectric layer 924. The at least one additional dielectric layer 924 can include a $SiO_2$ material, in some implementations. The at least one additional dielectric layer 924 can also include a $Si_2N_3$ material.

At 926, the process 900 can include forming a via 928 within the substrate 902. The via 928 can be formed using one or more chemical processes. The via 928 can be formed using one or more mechanical processes. The via 928 can be formed using a combination of one or more chemical processes and one or more mechanical processes. In one or more illustrative examples, the via 928 can be formed using one or more etching processes. One or more patterning processes can be used in combination with one or more etching processes to form the via 928. The substrate 902 can include an Si-containing substrate. In one or more examples, the substrate 902 can include an SiC-containing substrate. In additional examples, the substrate 902 can include a sapphire substrate. The substrate 902 can also include an AlN-containing substrate.

At operation 930, the process 900 can include filling the via 928 with at least one of a conductive material or a semiconductor material to produce a conductive structure 932. In various examples, the conductive structure 932 can modify an electric field produced by a transistor formed using the semiconductor layer 906. In this way, the conductive structure 932 can be a backside field plate with respect to a transistor formed using the semiconductor layer 906. The conductive structure 932 can be coupled to the source electrical contact 920. In additional examples, the conductive structure 932 can be coupled to the drain electrical contact 922.

The via 928 can be filled by implanting a conductive material into the via 928. The via 928 can also be filled by growing a conductive material. For example, one or more chemical vapor deposition techniques can be used to form the conductive structure 932. Additionally, the conductive structure 932 can be grown using one or more epitaxial techniques. The conductive structure 932 can include a GaN-containing material. The conductive structure 932 can also include a Ge-containing material. Further, the conductive structure 932 can include a polysilicon-containing material. In additional examples, the conductive structure 932 can include an SiC-containing material. In various implementations, the conductive structure 932 can include one or more combinations of an n-type material, a p-type material, an Si-containing material, a GaN-containing material, an SiC-containing material, a Ge-containing material, or a polysilicon-containing material.

Figure 10:
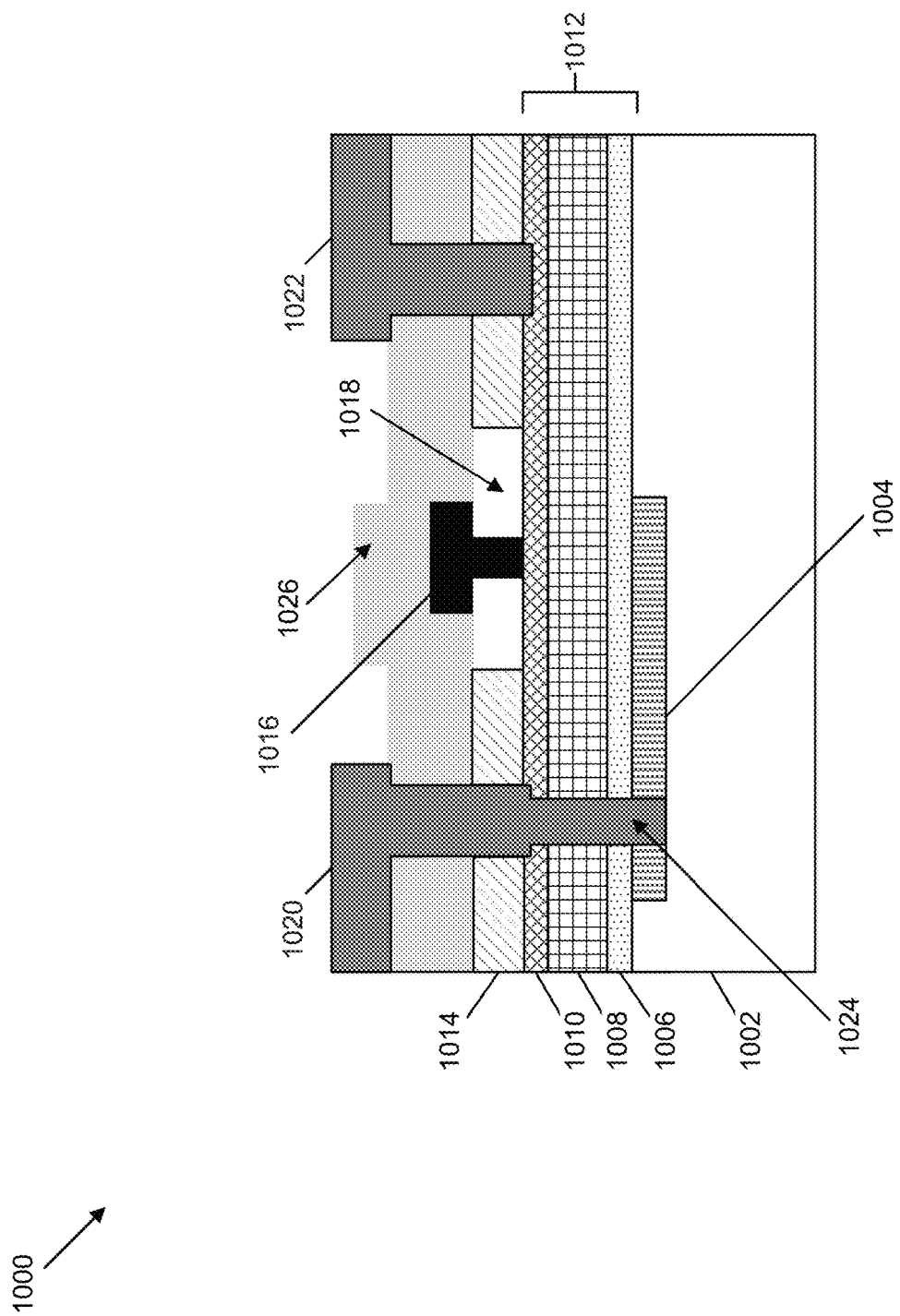
FIG. 10 is a diagram depicting a cross-section of at least a portion of components of an example integrated circuit including a compound semiconductor device having a T-shaped gate electrical contact with an air gap around at least a portion of the T-shaped gate electrical contact, and the integrated circuit including one or more conductive layers to modify an electric field produced by the compound semiconductor device.

FIG. 10 is a diagram depicting a cross-section of at least a portion of components of an example integrated circuit 1000 including a compound semiconductor device having a T-shaped gate electrical contact with an air gap around at least a portion of the T-shaped gate electrical contact, and the integrated circuit 900 including one or more conductive layers to modify an electric field produced by the semiconductor device. The integrated circuit 1000 can include a substrate 1002. In illustrative examples, the substrate 1002 can be an SiC-containing substrate. The substrate 1002 can also include an Si-containing substrate. Further, the substrate 1002 can include a sapphire substrate. Further, the substrate 1000 can include an AlN-containing substrate. A thickness of the substrate 1002 can be from about 100 micrometers to about 800 micrometers, from about 200 micrometers to about 700 micrometers, or from about 300 micrometers to about 600 micrometers.

A conductive layer 1004 can be disposed within the substrate 1002. The conductive layer 1004 can comprise a portion of a surface of the substrate 1002, in some examples. Further, the conductive layer 1004 can be located below a surface of the substrate 1002. In illustrative examples, the conductive layer 1004 can be located at one or more depths below a surface of the substrate 1002. For example, the conductive layer 1004 can be located from about 0 nanometers to no greater than about 100 nanometers below a surface of the substrate 1002. In addition, the conductive layer 1004 can be located from about 10 nanometers to no greater than about 100 nanometers below a surface of the substrate 1002. The conductive layer 1004 can also be located from about 50 nanometers to about 250 nanometers below a surface of the substrate 1002. Further, the conductive layer 1004 can be located from about 10 nm to about 500 nm below a surface of the substrate 1002.

The conductive layer 1004 can include an n-type material, in some implementations. The conductive layer 1004 can also include a p-type material. In illustrative examples, the conductive layer 1004 can include an Si-containing material. Additionally, the conductive layer 1004 can include a GaN-containing material. The conductive layer 1004 can also include a Ge-containing material. Further, the conductive layer 1004 can include a polysilicon-containing material. In additional examples, the conductive layer 1004 can include an SiC-containing material. In various implementations, the conductive layer 1004 can include one or more combinations of an n-type material, a p-type material, an Si-containing material, a GaN-containing material, an SiC-containing material, a Ge-containing material, or a polysilicon-containing material.

The conductive layer 1004 can be configured as a backside field plate to shape an electric field produced by compound semiconductor device of the integrated circuit 1000. A thickness of the conductive layer 1004 can be from about 200 nanometers (nm) to about 1500 nm, from about 300 nm to about 1200 nm, or from about 400 nm to about 1000 nm. Although a single conductive layer 1004 is shown in the illustrative example of FIG. 10, in additional implementations, a back-side field plate can include multiple conductive layers.

A nucleation layer 1006 can be disposed on the substrate 1002 and over the conductive layer 1004. The nucleation layer 1006 can have a thickness from about 10 nanometers to about 200 nanometers, from about 20 nanometers to about 100 nanometers, or from about 20 nanometers to about 80 nanometers. The nucleation layer 1006 can include an AlN-containing material. The nucleation layer 1006 can be used to form a first compound semiconductor layer 1008. The first compound semiconductor layer 1008 can include one or more compound semiconductors. the one or more compound semiconductors can include at least one element from Group 13 of the periodic table of elements and at least one element from Group 15 of the periodic table of elements. For example, the first compound semiconductor layer 1008 can include GaN. In addition, the first compound semiconductor layer 1008 can include GaAs. Further, the first compound semiconductor layer 1008 can include AlN. The first compound semiconductor layer 1008 can also include InP. The first compound semiconductor layer 1008 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm.

In addition, a second compound semiconductor layer 1010 can be disposed on the first compound semiconductor layer 1008. The second compound semiconductor layer 1010 can include one or more compound semiconductors. The one or more compound semiconductors can include at least one element from Group 13 of the periodic table of elements and at least one element from Group 15 of the periodic table of elements. For example, the second compound semiconductor material layer 1010 can be an AlGaN barrier layer, in various implementations. The second compound semiconductor material layer 1010 can also be an AlInGaN barrier layer. A 2-dimensional electron gas (2DEG) layer can be formed at the interface of the first compound semiconductor layer 1008 and the second compound semiconductor layer 1010 that enables the flow of electrons through the 2DEG. The nucleation layer 906, the first compound semiconductor layer 1008, and the second compound semiconductor layer 1010 can comprise a semiconductor layer 1012 that can be used to form one or more semiconductor devices, such as transistors. In illustrative examples, the 2DEG layer can be formed at an interface of a first compound semiconductor layer 1008 that is comprised of GaN and a second compound semiconductor layer 1010 comprised of AlGaN.

A first dielectric layer 1014 can be disposed on the second compound semiconductor layer 1010. The first dielectric layer 1014 can include a SiN-containing material. Additionally, a gate electrical contact 1016 can be disposed over a gate region of the second compound semiconductor layer 1010. The gate electrical contact 1016 can include one or more suitable metallic materials. For example, the gate electrical contact 1016 can include a titanium nitride (TiN)/Al material. The gate electrical contact 1016 can also include a nickel (Ni)/gold (Au) material.

The gate electrical contact 1016 can have a T-shape including a stem portion and a top portion supported by the stem portion. The T-shape of the gate electrical contact 1016 can corresponds to an amount of the top portion on one side of the stem portion being substantially equal to an amount of the top portion on another side of the stem portion. In the illustrative example of FIG. 10, the top portion can be disposed on the stem portion such that a substantially equal amount of the top portion is disposed on either side of the stem portion. A T-shaped gate electrical contact can be used in integrated circuits that operate at relatively high frequencies, such as at least 5 GHz. T-shaped gate electrical contacts located in integrated circuits operating at relatively high frequencies can have an air gap 1018 disposed around the gate electrical contact 1016. In conventional integrated circuits operating at relatively high frequencies of at least 5 GHz, air gaps around T-shaped gate electrical contacts can result in limitations to the voltages at which the conventional, high frequency integrated circuits can operate. The use of a conducting layer 1004 to function as a back-side field plate in the illustrative example of FIG. 10, can enable the integrated circuit 1000 to operate using higher voltages than conventional high frequency integrated circuits.

Further, a source electrical contact 1020 can be disposed over a source region of the semiconductor layer 1012 and a drain electrical contact 1022 can be disposed over a drain region of the semiconductor layer 1012. The source electrical contact 1020 and the drain electrical contact 1022 can include one or more suitable metallic materials. To illustrate, the source electrical contact 1020 and the drain electrical contact 1022 can include a Ti/Al material. In additional illustrative examples, the source electrical contact 1020 and the drain electrical contact 1022 can include a Ti/Au metallic material. A conductive layer contact 1024 can electrically couple the source electrical contact 1020 with the conductive layer 1004.

At least one additional dielectric layer 1026 can be disposed over the gate electrical contact 1016. Further, at least a portion of the source electrical contact 1020 and at least a portion of the drain electrical contact 1022 can be disposed within the at least one additional dielectric layer 1026. The at least one additional dielectric layer 1026 can include a $SiO_2$ material, in some implementations. The at least one additional dielectric layer 1026 can also include a $Si_2N_3$ material.

Furthermore, although the conductive layer 1004 is shown disposed under a portion of the source electrical contact 1020 and the gate electrical contact 1016, in additional implementations, the conductive layer 1004 can be disposed under at least one of the source electrical contact 1020, the gate electrical contact 1016, or the drain electrical contact 1022. Although not shown in the illustrative example of FIG. 10, the integrated circuit 1000 can include additional electronic components. For example, the integrated circuit 1000 can include one or more resistors. In addition, the integrated circuit 1000 can include one or more capacitors. Further, the integrated circuit 1000 can include one or more field plates disposed on or within one or more of the dielectric layers 1014, 1026. The integrated circuit 1000 can also include one or more inductors. In various examples, the integrated circuit 1000 can include one or more interconnect devices.

Figure 11:
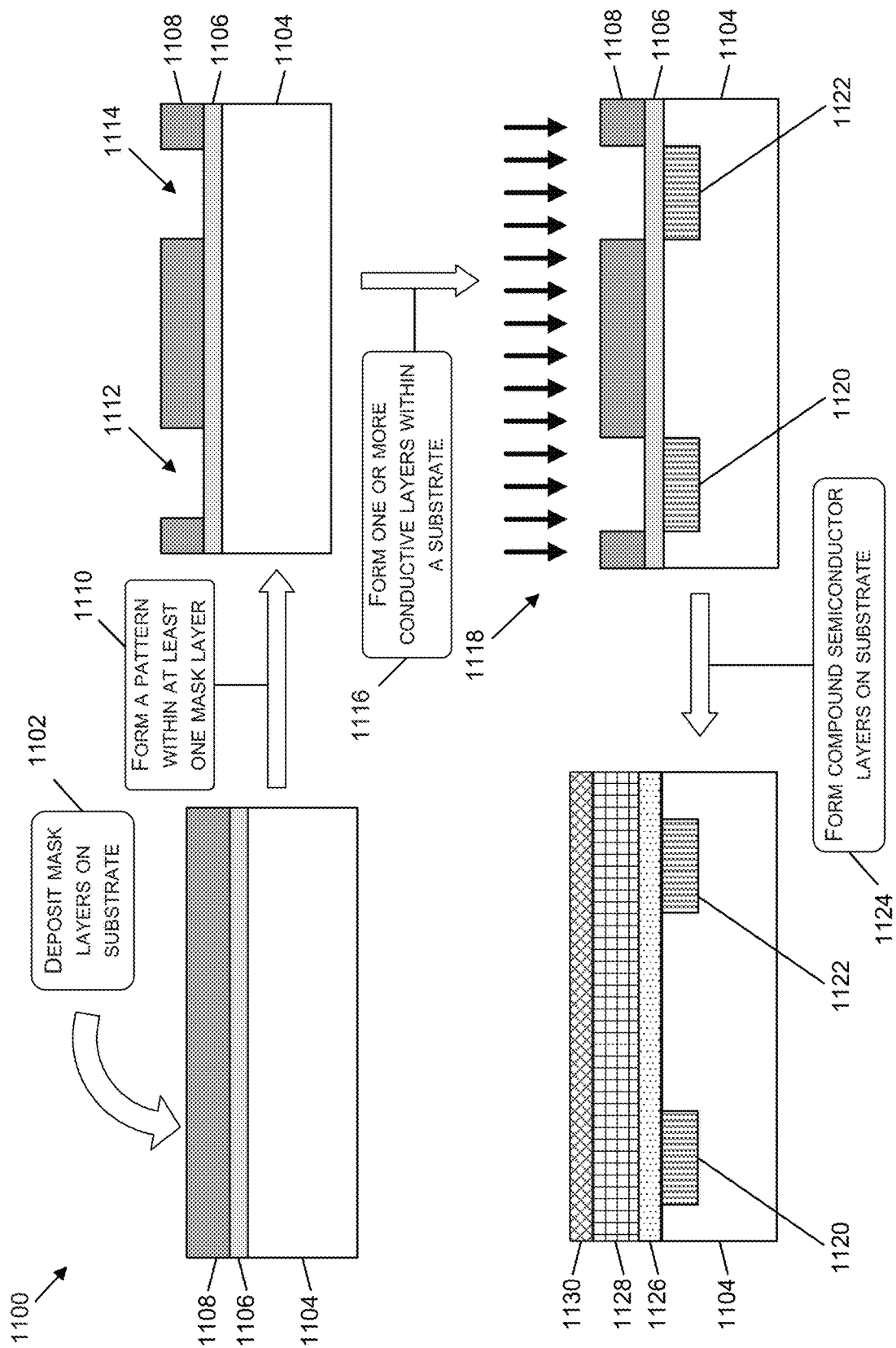
FIG. 11 is a diagram depicting an example process to implant one or more conductive layers within a substrate and form a gallium nitride-based semiconductor layer over the substrate that includes the one or more conductive layers.

FIG. 11 is a diagram depicting an example process 1100 to implant one or more conductive layers within a substrate and form a gallium nitride-based semiconductor layer over the substrate that includes the one or more conductive layers. The process 1100 can include, at 1102, depositing a plurality of mask layers on a substrate 1104. The substrate 1104 can be comprised of silicon (Si), silicon carbide (SiC), or sapphire, AlN or polycrystalline AlN.

In the illustrative example of FIG. 11, a first mask layer 1106 is deposited on the substrate 1104 and a second mask layer 1108 is deposited on the first mask layer 1106. In one or more examples, the substrate 1104 can include a silicon carbide-containing substrate. In addition, the first mask layer 1106 and the second mask layer 1108 can comprise different materials. For example, the first mask layer 1106 can comprise a first dielectric material and the second mask layer 1108 can comprise a second dielectric material. In one or more illustrative examples, the first mask layer 1106 can comprise SiN and the second mask layer 1108 can comprise $SiO_2$. In various examples, the first mask layer 1106 can have a thickness from about 500 Angstroms to about 2000 Angstroms or from about 750 Angstroms to about 1500 Angstroms. Additionally, the second mask layer 1108 can have a thickness from about 2000 Angstroms to about 5000 Angstroms or from about 2500 Angstroms to about 3500 Angstroms.

The process 1100 can also include, at 1110, forming a pattern within at least one mask layer. For example, a pattern can be formed in the second mask layer 1108 by forming a first recessed region 1112 and a second recessed region 1114 in the second mask layer 1108. The first recessed region 1112 and the second recessed region 1114 can be formed at least one of one or more etching processes. In various examples, one or more imaging processes can also be used to form the first recessed region 1112 and the second recessed region 1114.

In addition, the process 1100 can include, at 1116, forming one or more conductive layers within the substrate 1104. To illustrate, an implantation process 1118 can be performed to produce a first conductive layer 1120 and a second conductive layer 1122 within the substrate 1104. In one or more examples, the conductive layers 1120, 1122 can include at least one of a GaN-containing material with an n-type dopant or a GaN-containing material with a p-type dopant. Additionally, the conductive layers 1120, 1122 can include an Si-containing material. For example, the conductive layers 1120, 1122 can include at least one of an Si-containing material with an n-type dopant or an Si-containing material with a p-type dopant. Further, the conductive layers 1120, 1122 can include a Ge-containing material. In one or more illustrative examples, the conductive layers 1120, 1122 can include at least one of a Ge-containing material with a p-type dopant or a Ge-containing material with an n-type dopant. The conductive layers 1120, 1122 can be configured as a back-side field plate to shape an electric field produced by a compound semiconductor device of an integrated circuit that includes the compound semiconductor layer. A thickness of the conductive layers 1120, 1122 can be from about 200 nanometers (nm) to about 1500 nm, from about 300 nm to about 1200 nm, or from about 400 nm to about 1000 nm. Although two conductive layers 1120, 1122 are shown in the illustrative example of FIG. 11, a single conductive layer or multiple additional conductive layers can be formed in the substrate 1104.

Further, at 1124, the process 1124 can include forming a compound semiconductor layer on the substrate 1104. In various examples, the mask layers 1106, 1108 are removed and the compound semiconductor layer is then formed over the surface of the substrate 1104 and the conductive layers 1120, 1122. In one or more examples, a nucleation layer 1126 can be disposed on the substrate 1104 and over the conductive layers 1120, 1122. The nucleation layer 1126 can have a thickness from about 10 nanometers to about 200 nanometers, from about 20 nanometers to about 100 nanometers, or from about 20 nanometers to about 80 nanometers. The nucleation layer 1126 can include an AlN-containing material. The nucleation layer 1126 can be used to form a first compound semiconductor layer 1128. The first compound semiconductor layer 1128 can include one or more compound semiconductors. The one or more compound semiconductors can include at least one element from Group 13 of the periodic table of elements and at least one element from Group 15 of the periodic table of elements. For example, the first compound semiconductor layer 1128 can include GaN. In addition, the first compound semiconductor layer 1128 can include GaAs. Further, the first compound semiconductor material 1128 can include AlN. The first compound semiconductor material layer 1128 can also include InP. The first compound semiconductor layer 1128 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm. In illustrative examples, the thickness of the first compound semiconductor layer 208 can be less than the thickness of a compound semiconductor layer of conventional compound semiconductor devices.

In addition, a second compound semiconductor layer 1130 can be disposed on the first compound semiconductor layer 1128. The second compound semiconductor layer 1130 can include one or more compound semiconductors. The one or more compound semiconductors can include at least one element from Group 13 of the periodic table of elements and at least one element from Group 15 of the periodic table of elements. For example, the second compound semiconductor layer 1130 can be an AlGaN barrier layer, in various implementations. The second compound semiconductor layer 1130 can also be an AlInGaN barrier layer. A 2-dimensional electron gas (2DEG) layer can be formed at the interface of the first compound semiconductor layer 1128 and the second compound semiconductor layer 1130 that enables the flow of electrons through the 2DEG. The nucleation layer 1126, the first compound semiconductor layer 1128, and the second compound semiconductor layer 1130 can comprise a semiconductor layer that can be used to form one or more semiconductor devices, such as transistors. In illustrative examples, the 2DEG layer can be formed at an interface of a first compound semiconductor layer 1128 that is comprised of GaN and a second compound semiconductor layer 1130 comprised of AlGaN.

Although not shown in the illustrate example of FIG. 11, additional components can be formed on the compound semiconductor layer, such as one or more gate electrical contacts, one or more source electrical contacts, one or more drain electrical contacts, one or more additional field plates, one or more capacitors, one or more inductors, one or more interconnects, one or more combinations thereof, and the like.

Additionally, in various examples, the use of multiple masking layers to produce the conductive layers 1120, 1122 can minimize defects found in devices that include the compound semiconductor layer comprised of the nucleation layer 1126, the first compound semiconductor layer 1128, and the second compound semiconductor layer 1130. For example, the implantation process 1118 can cause damage to occur to the substrate 1104 when the substrate 1104 is directly exposed during the implantation process 1118. To illustrate, divots or recessed regions can be formed in the substrate 1104 at portions of the substrate 1104 that are directly exposed during the implantation process 1118. In one or more illustrative examples, the divots can have an average depth from about 25 nm to about 500 nm. The presence of divots in the substrate 1104 can cause uneven distribution of the layers of the compound semiconductor layer that can result in defects and/or decreased performance of compound semiconductor devices. The process described with respect to FIG. 11 can decrease defects in compound semiconductor devices formed according to implementations herein by providing a protective masking layer 1106 that protects the surface of the substrate 1104 during the implantation process 1118. Thus, the surface of the substrate 1104 can be free of divots prior to the compound semiconductor layer being formed on the substrate 1104. In addition, the protective masking layer 1106 can protect the substrate 1104 during the processes used to form the pattern in the second masking layer 1108.

Figure 12:
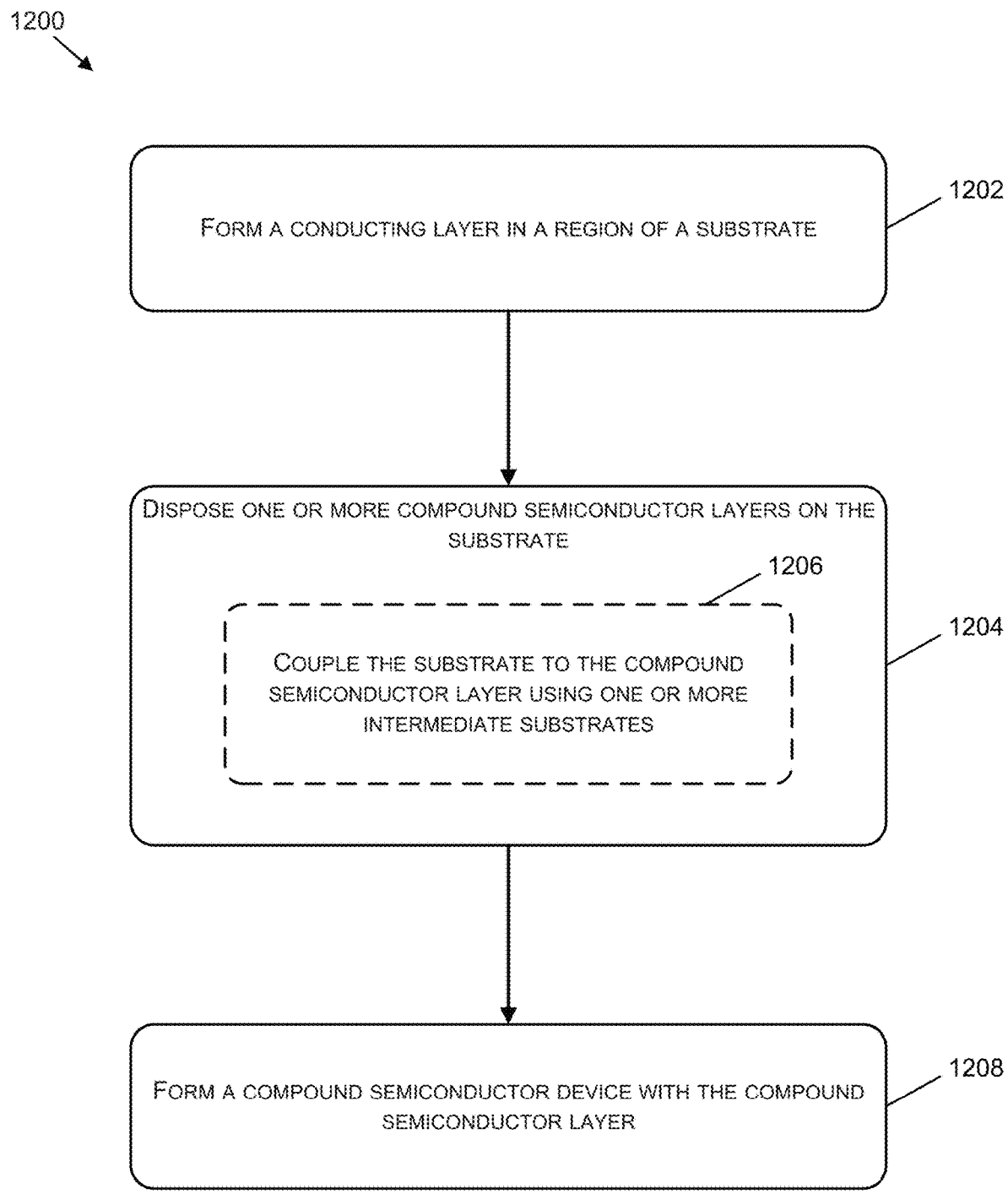
FIG. 12 is a flow diagram depicting operations of an example process to form one or more conductive layers in a substrate on which a compound semiconductor layer is disposed.

FIG. 12 is a flow diagram depicting operations of an example process 1200 to form one or more conductive layers in a substrate on which a compound material semiconductor layer is disposed. At operation 1202, the process

1200 can include forming a conductive layer in a region of a substrate. The conductive layer can include one or more conducting materials and/or one or more semi-conducting materials. For example, the conductive layer can comprise one or more n-type materials. In additional examples, the conductive layer can include one or more p-type materials. In illustrative examples the conductive layer can comprise GaN. Additionally, the conductive layer can comprise Ge. Further, the conductive layer can comprise Si. Additionally, the substrate can be an Si-containing substrate. In various examples, the substrate can be an SiC-containing substrate. The substrate can also include sapphire.

In various implementations, the conductive layer can be formed within a trench of the substrate. To illustrate, a portion of a surface of the substrate can be removed to form a recessed region within the substrate. The conductive layer can then be grown in the trench of the substrate. The conductive layer can also be implanted into the trench of the substrate. In additional implementations, the conductive layer can be implanted on or below a surface of the substrate without producing a trench before forming the conductive layer. Further, the conductive layer can be grown on or below a surface of the substrate without producing a trench before forming the conductive layer.

At operation 1204, the process 1200 can include disposing one or more compound semiconductor layers on the substrate. The one or more compound semiconductor layers can include a channel GaN layer. The GaN channel layer can have a thickness that is no greater than about 1000 nm, no greater than about 900 nm, no greater than about 750 nm, no greater than about 500 nm, no greater than about 300 nm, or no greater than about 200 nm. In illustrative examples, the GaN channel layer can have a thickness that is from about 50 nm to about 1000 nm, from about 300 nm to about 600 nm, from about 50 nm to about 300 nm, or from about 100 nm to about 400 nm. In addition, the one or more compound semiconductor layers can include a barrier layer. The barrier layer can include an AlGaN barrier layer. Further, one or more compound semiconductor layers can include one or more additional layers, such as one or more nucleation layers, one or more buffer layers, or one or more combinations thereof.

The one or more compound semiconductor layers can be disposed on the substrate by growing a first compound semiconductor layer and a second compound semiconductor layer on the substrate. To illustrate, a GaN channel layer and an AlGaN barrier layer can be grown using one or more epitaxial processes. Additionally, the one or more compound semiconductor layers can be coupled to the substrate in a manner that minimizes the distance between the conducting layer and a semiconductor device formed with the compound material semiconductor layer. A distance between the compound semiconductor device and the substrate can also be minimized by using at least one thinner compound semiconductor layer than conventional integrated circuits. In this way, the SiC-containing substrate can dissipate heat generated by a semiconductor device formed from the one or more compound semiconductor layers. As a result, the performance of an integrated circuit that comprises a semiconductor device formed from the one or more compound semiconductor layers can be improved in relation to conventional semiconductor devices that have a larger distance between the semiconductor device and a heat dissipating substrate.

In alternative implementations, disposing one or more compound semiconductor layers on the substrate can include, at operation 1206, coupling the substrate to the one or more compound semiconductor layers using one or more intermediate substrates. For example, the one or more compound semiconductor layers can be formed on an intermediate substrate. The intermediate substrate can be an Si-containing substrate. The one or more compound semiconductor layers can then be separated from the intermediate substrate. In various implementations, a GaN channel layer of the one or more compound semiconductor layers can be thinned such that the thickness of the GaN channel layer is reduced. Subsequently, the GaN channel layer with the reduced thickness can be coupled to another intermediate substrate. The second intermediate substrate can comprise a sapphire-containing substrate. The substrate assembly including the one or more compound semiconductor layers and the second intermediate substrate can be coupled to the substrate that has the conductive layer. The second intermediate substrate can then be removed from the compound semiconductor substrate layer. The resulting structure can comprise the substrate with the conductive layer coupled to the one or more compound semiconductor layers with the reduced thickness GaN channel layer.

The process 1200 can also include, at operation 1208, forming a compound semiconductor device with the one or more compound semiconductor layers. The compound semiconductor device can include a transistor, such as a high electron mobility transistor. To illustrate, the one or more compound semiconductor layers can include a drain region, a gate region, and a source region. In illustrative examples, at least one of the drain region, the gate region, or the source region can include one or more dopants. Forming the compound semiconductor device can include forming an electrical contact on the drain region, an electrical contact on the gate region, and an electrical contact on the source region.

The conductive layer in the substrate can function as a field plate disposed below the compound semiconductor device. In this way, the conductive layer can function as a back-side field plate that can modify an electric field produced by the compound semiconductor device. Using the conductive layer to modify the electric field of the compound semiconductor device can help to improve performance of an integrated circuit that includes the compound semiconductor device.

A numbered non-limiting list of aspects of the present subject matter is presented below.

Aspect 1. A process to modify an electric field produced by a semiconductor device comprises: forming a conductive layer in a region of a substrate; disposing a compound semiconductor layer on the substrate, the compound semiconductor layer including a barrier layer and a channel layer, the channel layer being comprised of a compound material having a Group 13 element and Group 15 element; and forming the semiconductor device with the compound semiconductor layer; wherein the conductive layer is configured to modify the electric field produced by the semiconductor device.

Aspect 2. The process of aspect 1, wherein the substrate is comprised of silicon (Si), silicon carbide (SiC), or sapphire, AlN or polycrystalline AlN Aspect 3. The process of aspect 1 or aspect 2, wherein the channel layer includes gallium nitride (GaN), gallium arsenide (GaAs), indium phosphide (InP), or aluminum nitride (AlN).

Aspect 4. The process of any one of aspects 1-3, wherein disposing the compound semiconductor layer on the substrate comprises: forming an aluminum nitride (AlN) nucleation layer over the substrate and over the conductive layer;

forming the channel layer on the nucleation layer; and forming the barrier layer on the channel layer.

Aspect 5. The process of any one of aspects 1-4, comprises: forming an initial channel layer on an Si-containing substrate, the initial channel layer having a first thickness; forming the carrier layer on the initial channel layer; reducing the first thickness of the initial channel layer to a second thickness to produce a modified channel layer; and separating the Si-containing substrate from the modified channel layer to produce the compound semiconductor layer.

Aspect 6. The process of aspect 5, wherein disposing the compound semiconductor layer on the SiC-containing substrate comprises: coupling the compound semiconductor layer to a carrier substrate to produce a first intermediate substrate assembly; coupling the intermediate substrate assembly to the SiC-containing substrate to produce a second intermediate substrate assembly; and separating the carrier substrate from the second intermediate substrate assembly.

Aspect 7. The process of aspect 6, wherein the compound semiconductor layer is coupled to the carrier substrate with one or more bonding layers and separating the carrier substrate from the second intermediate substrate assembly includes removing at least a portion of the one or more bonding layers.

Aspect 8. The process of aspect 5, wherein the Si-containing substrate is separated from the channel layer by at least one of one or more chemical-based processes or one or more mechanical processes.

Aspect 9. The process of aspect 5, wherein the first thickness of the initial channel layer is reduced to the second thickness by chemical mechanical polishing.

Aspect 10. The process of aspect 5, wherein the first thickness of the initial channel layer is reduced to the second thickness by one or more chemical-based processes.

Aspect 11. The process of aspect 5, wherein the carrier substrate includes a sapphire-containing substrate, a poly-AlN containing substrate, or an SiC-containing substrate.

Aspect 12. The process of aspect 5, wherein the first thickness is from about 500 nanometers (nm) to about 1000 nm and the second thickness is from about 50 nm to about 300 nm.

Aspect 13. The process of any one of aspects 1-12, wherein forming the conductive layer in the region of the substrate comprises: forming a trench in a surface of the substrate; and depositing at least one of a conducting material or a semi-conducting material in the trench.

Aspect 14. The process of aspect 13, wherein the trench is formed using at least one of one or more chemical-based processes or one or more mechanical processes.

Aspect 15. The process of aspect 13, wherein the conductive layer includes a GaN-containing material.

Aspect 16. The process of any one of aspects 1-15, wherein forming the conductive layer in the region of the substrate comprises performing one or more implantation processes to dispose a conductive material within the substrate.

Aspect 17. The process of aspect 16, wherein the conductive layer is located at a depth from a surface of the substrate that contacts the channel layer.

Aspect 18. The process of aspect 17, wherein the depth is from about 10 nm to about 500 nm.

Aspect 19. The process of aspect 16, wherein forming the conductive material includes at least one of a conducting material or a semi-conducting material in the region of the substrate.

Aspect 20. The process of any one of aspects 1-19, wherein: a two-dimensional electron gas (2DEG) layer is formed at an interface between the channel layer and the barrier layer; and the conductive layer and the semiconductor device are arranged such that a distance between the 2DEG layer and the substrate is minimized.

Aspect 21. The process of any one of aspects 1-20, comprising applying a positive voltage to the conductive layer.

Aspect 22. The process of any one of aspects 1-21, comprising applying a negative voltage to the conductive layer.

Aspect 23. The process of any one of aspects 1-22, wherein a thickness of the channel layer and a nucleation layer disposed adjacent to the channel layer is from about 50 nm to about 500 nm.

Aspect 24. A semiconductor device including a back-side field plate to modify an electric field produced by the semiconductor device, the semiconductor device comprising: a substrate including a conductive layer disposed in a region of the substrate, the conductive layer comprising at least a portion of the back-side field plate and the conductive layer comprising at least one of a conducting material or a semi-conducting material; a channel layer disposed on a surface of the substrate, the channel layer being comprised of a first compound material having a Group 13 element and Group 15 element; and a barrier layer disposed on the channel layer, the barrier layer being comprised of a second compound material having a Group 13 element and a Group 15 element.

Aspect 25. The semiconductor device of aspect 24, wherein the conductive layer includes at least one of an n-type dopant, a p-type dopant, germanium (Ge), Si, SiC, or GaN.

Aspect 26. The semiconductor device of aspect 24 or aspect 25, wherein the barrier layer includes aluminum gallium nitride (AGaN) or aluminum indium gallium nitride (AlInGaN).

Aspect 27. The semiconductor device of any one of aspects 24-26, wherein the region that includes the conductive layer is adjacent to a surface of the substrate or forms a surface of the SiC-containing substrate.

Aspect 28. The semiconductor device of any one of aspects 24-27, wherein the substrate is comprised of at least one of silicon (Si), silicon carbide (SiC), sapphire, aluminum nitride (AlN), or polycrystalline AlN.

Aspect 29. The semiconductor device of any one of aspects 24-28, wherein the channel layer includes gallium nitride (GaN), gallium arsenide (GaAs), indium phosphide (InP), or aluminum nitride (AlN).

Aspect 30. The semiconductor device of any one of aspects 24-29, further comprising one or more bonding layers disposed between the substrate and the channel layer.

Aspect 31. The semiconductor device of any one of aspects 24-30, wherein the channel layer includes GaN and has a thickness from about 50 nanometers (nm) to about 200 nm.

Aspect 32. The semiconductor device of any one of aspects 24-31, wherein the barrier layer and the channel layer comprise a semiconductor layer and the semiconductor layer includes a gate region, a source region, and a drain region, and the semiconductor device comprises: a gate electrical contact coupled to the gate region; a source electrical contact coupled to the source region; and a drain electrical contact coupled to the drain region.

Aspect 33. The semiconductor device of aspect 32, wherein the gate electrical contact, the source electrical contact, and the drain electrical contact are part of a high electron mobility transistor (HEMT).

Aspect 34. The semiconductor device of aspect 32, comprising a field plate disposed over at least a portion of the gate electrical contact and the conductive layer is aligned with at least a portion of the gate electrical contact and at least a portion of the field plate.

Aspect 35. The semiconductor device of aspect 32, comprising a conductive layer contact that couples the conductive layer to the source electrical contact.

Aspect 36. The semiconductor device of aspect 35, comprising: an additional conductive layer disposed in an additional region of the substrate, the additional conductive layer comprising at least one of a conducting material or a semi-conducting material; and an additional conductive layer contact that couples the additional conductive layer to the drain electrical contact.

Aspect 37. The semiconductor device of aspect 36, wherein: the conductive layer includes a p-type material; the additional conductive layer includes an n-type material; and the substrate includes a p-type material.

Aspect 38. The semiconductor device of any one of aspects 24-37, wherein the conductive layer is one of a plurality of conductive layers that comprise the back-side field plate.

Aspect 39. The semiconductor device of any one of aspects 24-38, comprising a nucleation layer disposed between the substrate and the channel layer, the nucleation layer comprising an aluminum nitride (AlN)-containing material.

Aspect 40. The semiconductor device of any one of aspects 24-39, comprising a conductive layer contact coupled to the conductive layer and to a voltage source, wherein a voltage can be applied to the conductive layer by the voltage source using the conductive layer contact.

Aspect 41. The semiconductor device of aspect 40, wherein the voltage is a positive voltage having a value greater than 0.

Aspect 42. The semiconductor device of aspect 40, wherein the voltage is a negative voltage having a value less than 0.

Aspect 43. The semiconductor device of any one of aspects 24-42, wherein a thickness of the channel layer and a nucleation layer disposed adjacent to the channel layer is from about 50 nm to about 500 nm.

Aspect 44. A semiconductor device including a back-side field plate to modify an electric field produced by the semiconductor device, the semiconductor device comprising: a substrate including a plurality of conductive layers disposed in a substrate, a first conductive layer of the plurality of conductive layers being located at a first depth in the substrate and a second conductive layer of the plurality of conductive layers being located at a second depth in the substrate, the second depth being different from the first depth; and a semiconductor layer including a channel layer and a barrier layer, the channel layer being comprised of a compound material having a Group 13 element and Group 15 element.

Aspect 45. The semiconductor device of aspect 44, wherein the first conductive layer is offset laterally from the second conductive layer.

Aspect 46. The semiconductor device of aspect 44 or aspect 45, wherein: the first conductive layer includes a p-type material and the second conductive material includes the p-type material; and an additional layer including an n-type material is disposed between the first conductive layer and the second conductive layer.

Aspect 47. The semiconductor device of any one of aspects 44-46, wherein: the first conductive layer includes an n-type material and the second conductive material includes an n-type material; and an additional layer including a p-type material is disposed between the first conductive layer and the second conductive layer.

Aspect 48. The semiconductor device of any one of aspects 44-47, wherein the first depth is from about 10 nm to about 500 nm and the second depth is from about 400 nm to about 2000 nm.

Aspect 49. The semiconductor device of any one of aspects 44-48, wherein the barrier layer is comprised of an additional compound material having a Group 13 element and a Group 15 element.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These implementations are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. An integrated circuit including a back-side field plate to modify an electric field produced by at least one semiconductor device, the integrated circuit comprising:
    a substrate including a plurality of conductive layers disposed in a region of the substrate, the plurality of conductive layers comprising at least a portion of the back-side field plate and including a first conductive layer comprising a p-type material, a second conductive layer comprising the p-type material, and an additional layer including an n-type material disposed between the first conductive layer and the second conductive layer, wherein the first conductive layer is located at a first depth in the substrate and the second conductive layer is located at a second depth in the substrate, the second depth being different from the first depth, and wherein the first conductive layer modifies a first range of electric field strengths and the second conductive layer modifies a second range of electric field strengths that is different from the first range of electric field strengths;
    a channel layer disposed on a surface of the substrate, the channel layer being comprised of a first compound material having a Group 13 element and Group 15 element; and
    a barrier layer disposed on the channel layer, the barrier layer being comprised of a second compound material having a Group 13 element and a Group 15 element.

2. The integrated circuit of claim 1, wherein:
    the barrier layer includes aluminum gallium nitride (AlGaN) or aluminum indium gallium nitride (AlInGaN);
    the substrate is comprised of at least one of Si, SiC, sapphire, aluminum nitride (AlN), or polycrystalline AlN; and
    the channel layer includes GaN, gallium arsenide (GaAs), indium phosphide (InP), or AlN.

3. The integrated circuit of claim 1, wherein the region that includes the plurality of conductive layers is adjacent to a surface of the substrate or forms a surface of the substrate.

4. The integrated circuit of claim 1, comprising:
    a first dielectric layer disposed on the barrier layer; and
    a second dielectric layer disposed on the first dielectric layer;
    wherein a source electrical contact and a drain electrical contact extend through the first dielectric layer and the second dielectric layer.

5. The integrated circuit of claim 4, wherein a gate electrical contact, the source electrical contact, and the drain electrical contact are part of a high electron mobility transistor (HEMT).

6. The integrated circuit of claim 5, comprising a field plate disposed over at least a portion of the gate electrical contact and the plurality of conductive layers are aligned with at least a portion of the gate electrical contact and at least a portion of the field plate.

7. The integrated circuit of claim 5, wherein the back-side field plate disposed over at least the portion of the gate electrical contact includes a first additional conductive layer vertically aligned with the first conductive layer and a second additional conductive layer vertically aligned with the second conductive layer.

8. The integrated circuit of claim 1, wherein:
    the substrate includes a p-type material.

9. The integrated circuit of claim 1, wherein the first conductive layer is offset laterally with respect to the second conductive layer.

10. The integrated circuit of claim 1, wherein a thickness of the channel layer and a nucleation layer disposed adjacent to the channel layer is from about 50 nm to about 500nm.

11. A semiconductor device including a back-side field plate to modify an electric field produced by the semiconductor device, the semiconductor device comprising:
    a semiconductor device substrate including a plurality of conductive layers disposed in the semiconductor device substrate, a first conductive layer of the plurality of conductive layers being located at a first depth in the semiconductor device substrate and including an n-type material and a second conductive layer of the plurality of conductive layers being located at a second depth in the semiconductor device substrate and including the n-type material, the second depth being different from the first depth, and wherein the first conductive layer modifies a first range of electric field strengths, the second conductive layer modifies a second range of electric field strengths that is different from the first range of electric field strengths, and an additional layer including a p-type material is disposed between the first conductive layer and the second conductive layer; and
    a compound semiconductor layer disposed on the semiconductor device substrate and the compound semiconductor layer including a channel layer and a barrier layer, the channel layer being comprised of a compound material having a Group 13 element and Group 15 element.

12. The semiconductor device of claim 11, wherein the first conductive layer is offset laterally from the second conductive layer.

13. The semiconductor device of claim 11, wherein the first conductive layer and the second conductive layer are coupled to a drain electrical contact.

14. The semiconductor device of claim 11, wherein the first range of electric field strengths is from about 1 Volt/meter (V/m) to about 20 V/m and the second range of electric field strengths is from about 20 V/m to about 40 V/m.

15. The semiconductor device of claim 11, wherein the first depth is from about 10nm to about 500 nm and the second depth is from about 400 nm to about 2000 nm.

16. A process to modify an electric field produced by a semiconductor device comprises:
    forming a first conductive layer located at a first depth of a substrate and a second conductive layer at a second depth of the substrate, wherein the second depth is different from the first depth, the first conductive layer includes a p-type material, the second conductive layer includes the p-type material, and an additional layer including an n-type material is disposed between the first conductive layer and the second conductive layer;
    disposing a compound semiconductor layer on the substrate, the compound semiconductor layer including a barrier layer and a channel layer, the channel layer being comprised of a compound material having a Group 13 element and Group 15 element; and
    forming the semiconductor device with the compound semiconductor layer;

wherein the first conductive layer is configured to modify a first range of electric field strengths and the second conductive layer is configured to modify a second range of electric field strengths that is different from the first range of electric field strengths.

17. The process of claim 16, wherein forming the first conductive layer and the second conductive layer in the substrate comprises performing one or more implantation processes to dispose a conductive material within the substrate.

18. The process of claim 17, comprising:
forming a first dielectric layer on the substrate;
forming a second dielectric layer on the first dielectric layer; and
forming a pattern in the second dielectric layer.

19. The process of claim 18, wherein:
the one or more implantation processes produce one or more portions of at least one of the first conductive layer or the second conductive layer within the substrate according to the pattern; and
the process comprises removing the first dielectric layer and the second dielectric layer before disposing the compound semiconductor layer on the substrate.

20. The process of claim 16, wherein:
the substrate is free of divots before disposing the compound semiconductor layer on the substrate;
a two-dimensional electron gas (2DEG) layer is formed at an interface between the channel layer and the barrier layer; and
a distance between a top surface of the first conductive layer and the interface between the channel layer and the barrier layer is no greater than about 1000 nanometers.

* * * * *